(12) United States Patent
Borodovsky et al.

(10) Patent No.: US 10,216,087 B2
(45) Date of Patent: *Feb. 26, 2019

(54) EBEAM UNIVERSAL CUTTER

(71) Applicant: Intel Corporation, Santa Clara, CA (US)

(72) Inventors: Yan A. Borodovsky, Portland, OR (US); Donald W. Nelson, Beaverton, OR (US); Mark C. Phillips, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/122,622

(22) PCT Filed: Dec. 19, 2014

(86) PCT No.: PCT/US2014/071670
§ 371 (c)(1),
(2) Date: Aug. 30, 2016

(87) PCT Pub. No.: WO2015/191107
PCT Pub. Date: Dec. 17, 2015

(65) Prior Publication Data
US 2017/0102615 A1    Apr. 13, 2017

Related U.S. Application Data

(60) Provisional application No. 62/012,217, filed on Jun. 13, 2014.

(51) Int. Cl.
*G03F 7/20* (2006.01)
*H01L 21/027* (2006.01)
(Continued)

(52) U.S. Cl.
CPC ........ *G03F 7/2037* (2013.01); *H01J 37/3174* (2013.01); *H01L 21/0277* (2013.01); *H01L 21/31144* (2013.01)

(58) Field of Classification Search
None
See application file for complete search history.

(56) References Cited

U.S. PATENT DOCUMENTS 5,424,548 A    6/1995   Puisto
5,430,304 A    7/1995   Yasuda et al.
(Continued)

FOREIGN PATENT DOCUMENTS

JP    S59-189628 A    10/1984
JP    H3-104111 A     5/1991
(Continued)

OTHER PUBLICATIONS

Non-Final Office Action and Search Report for Taiwanese Patent Application No. 10411424 dated Nov. 7, 2016, 7 pgs., English translation.
(Continued)

*Primary Examiner* — Reema Patel
*Assistant Examiner* — Steven M Christopher
(74) *Attorney, Agent, or Firm* — Schwabe, Williamson & Wyatt, P.C.

(57) ABSTRACT

Lithographic apparatuses suitable for, and methodologies involving, complementary e-beam lithography (CEBL) are described. In an example, a blanker aperture array (BAA) for an e-beam tool includes a first column of openings along a first direction. The BAA also includes a second column of openings along the first direction and staggered from the first column of openings. The first and second columns of openings together form an array having a pitch in the first direction. A scan direction of the BAA is along a second (Continued)

direction, orthogonal to the first direction. The pitch of the array corresponds to half of a minimal pitch layout of a target pattern of lines for orientation parallel with the second direction.

8 Claims, 35 Drawing Sheets

(51) Int. Cl.
*H01J 37/317* (2006.01)
*H01L 21/311* (2006.01)

(56) References Cited

U.S. PATENT DOCUMENTS

| | | | |
|---|---|---|---|
| 5,578,821 | A | 11/1996 | Meisberger et al. |
| 6,333,508 | B1 | 12/2001 | Katsap et al. |
| 9,899,182 | B2* | 2/2018 | Borodovsky ......... H01J 37/045 |
| 2002/0104970 | A1* | 8/2002 | Winter .................. B82Y 10/00 250/400 |
| 2003/0155534 | A1 | 8/2003 | Platzgummer et al. |
| 2012/0219914 | A1 | 8/2012 | Muraki |
| 2015/0243480 | A1* | 8/2015 | Yamada ................. H01J 37/20 250/492.22 |

FOREIGN PATENT DOCUMENTS

| | | |
|---|---|---|
| JP | H5-67563 A | 3/1993 |
| JP | H5-267135 A | 10/1993 |
| JP | H6-302506 A | 10/1994 |
| JP | H9-167728 A | 6/1997 |
| JP | H10-74677 A | 3/1998 |
| JP | 2004-79646 A | 3/2004 |
| JP | 2013093567 | 5/2013 |
| JP | 2013-140998 A | 7/2013 |
| JP | 2013-157547 | 8/2013 |
| JP | 2014-72226 A | 4/2014 |
| JP | 2016-96179 | 5/2016 |
| KR | 10-2000-076936 | 12/2000 |
| TW | 200739645 | 10/2007 |
| TW | 201324571 | 6/2013 |
| TW | 1463515 | 12/2014 |
| WO | WO-2010094719 | 8/2010 |

OTHER PUBLICATIONS

International Search Report and Written Opinion for PCT Application No. PCT/US2014/071670 dated Mar. 31, 2015, 13 pgs.
Borodovsky, Yan, "Complementary Lithography at Insertion and Beyond", Semicon West 2012, Jun. 11, 2012, San Francisco, CA, USA, 30 pgs.
International Preliminary Report on Patentability for PCT Patent Application No. PCT/US14/71670 dated Dec. 22, 2016, 10 pgs.
Hiroshi Yasuda "Fast Electron Beam Lithography System with 1024 Beams Individually Controlled by Blanking Aperature Array," Jpn. J. Appl. Phys, vol. 32, Part 1, No. 12B, Dec. 1, 1993, pp. 6012-6017.
Search Report for European Patent Application No. 14894455.6 dated Jan. 2, 2018, 14 pages.
Office Action from Taiwan Patent Application No. 106122898 dated Jun. 12, 2018, 7 pages.
Office Action for Taiwan Patent Application No. 106122898, dated Oct. 11, 2018, 2 pages.
Office Action from Japanese Patent Application No. 2016-566247 dated Nov. 22, 2018, 9 pages.

* cited by examiner $$\text{bits/m}^2 = \text{bits/pixel} * 1/(\text{pixelsize})^2 \quad (A)$$

$$\frac{\text{bits}}{\text{pixel}} = \log_2\left(1 + \frac{A_p}{\Delta PV}\right) \quad (B)$$

$$0.5 * \log_2(1+10/5) * 1/(10*10^{-9})^2 = 0.5 * 1.585 * 10^{16} \text{ bits/m}^2 = 7.925 * 10^{15} \text{bits/m}^2 \quad (C)$$

$$0.0706 * 7.925 * 10^{15} = 5.595 * 10^{14} \text{ bits} = 7 * 10^{13} \text{ bytes} \quad (D)$$

FIG. 7

PLAN VIEW 3500

CROSS-SECTIONAL VIEWS

EBEAM UNIVERSAL CUTTER

CROSS-REFERENCE TO RELATED APPLICATIONS

This patent application is a U.S. National Phase application under 35 U.S.C. § 371 of International Application No. PCT/US2014/071670, filed Dec. 19, 2014, entitled "EBEAM UNIVERSAL CUTTER," which claims the benefit of U.S. Provisional Application No. 62/012,217, filed on Jun. 13, 2014, the entire contents of which are hereby incorporated by reference herein.

TECHNICAL FIELD

Embodiments of the invention are in the field of lithography and, in particular, lithography involving complementary e-beam lithography (CEBL).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

Integrated circuits commonly include electrically conductive microelectronic structures, which are known in the art as vias. Vias can be used to electrically connect metal lines above the vias to metal lines below the vias. Vias are typically formed by a lithographic process. Representatively, a photoresist layer may be spin coated above a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias. When patterning extremely small vias with extremely small pitches by such lithographic processes, several challenges present themselves.

One such challenge is that the overlay between the vias and the overlying metal lines, and the overlay between the vias and the underlying metal lines, generally needs to be controlled to high tolerances on the order of a quarter of the via pitch. As via pitches scale ever smaller over time, the overlay tolerances tend to scale with them at an even greater rate than lithographic equipment is able to scale with.

Another such challenge is that the critical dimensions of the via openings generally tend to scale faster than the resolution capabilities of lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing. A further such challenge is that the extremely small via pitches generally tend to be below the resolution capabilities of even extreme ultraviolet (EUV) lithographic scanners. As a result, commonly two, three, or more different lithographic masks may have to be used, which tends to increase the fabrication costs. At some point, if pitches continue to decrease, it may not be possible, even with multiple masks, to print via openings for these extremely small pitches using conventional scanners.

In the same vein, the fabrication of cuts (i.e., disruptions) in the metal line structures associated with metal vias is faced with similar scaling issues.

Thus, improvements are needed in the area of lithographic processing technologies and capabilities.

BRIEF DESCRIPTION OF THE DRAWINGS

FIG. 7 provides a sample calculation showing the information to be transferred to pattern a general/conventional layout at 50% density on a 300 mm wafer in contrast to a via pattern at 5% density, in accordance with an embodiment of the present invention.

DESCRIPTION OF THE EMBODIMENTS

Lithographic apparatuses suitable for, and methodologies involving, complementary e-beam lithography (CEBL) are described. In the following description, numerous specific details are set forth, such as specific tooling, integration and material regimes, in order to provide a thorough understanding of embodiments of the present invention. It will be apparent to one skilled in the art that embodiments of the present invention may be practiced without these specific details. In other instances, well-known features, such as single or dual damascene processing, are not described in detail in order to not unnecessarily obscure embodiments of the present invention. Furthermore, it is to be understood that the various embodiments shown in the Figures are illustrative representations and are not necessarily drawn to scale. In some cases, various operations will be described as multiple discrete operations, in turn, in a manner that is most helpful in understanding the present invention, however, the order of description should not be construed to imply that these operations are necessarily order dependent. In particular, these operations need not be performed in the order of presentation.

One or more embodiments described herein are directed to lithographic approaches and tooling involving or suitable for complementary e-beam lithography (CEBL), including semiconductor processing considerations when implementing such approaches and tooling.

Complementary lithography draws on the strengths of two lithography technologies, working hand-in-hand, to lower the cost of patterning critical layers in logic devices at 20 nm half-pitch and below, in high-volume manufacturing (HVM). The most cost-effective way to implement complementary lithography is to combine optical lithography with e-beam lithography (EBL). The process of transferring integrated circuit (IC) designs to the wafer entails the following: optical lithography to print unidirectional lines (either strictly unidirectional or predominantly unidirectional) in a pre-defined pitch, pitch division techniques to increase line density, and EBL to "cut" the lines. EBL is also used to pattern other critical layers, notably contact and via holes. Optical lithography can be used alone to pattern other layers. When used to complement optical lithography, EBL is referred to as CEBL, or complementary EBL. CEBL is directed to cutting lines and holes. By not attempting to pattern all layers, CEBL plays a complementary but crucial role in meeting the industry's patterning needs at advanced (smaller) technology nodes (e.g., 10 nm or smaller such as 7 nm or 5 nm technology nodes). CEBL also extends the use of current optical lithography technology, tools and infrastructure.

Figure 1A:
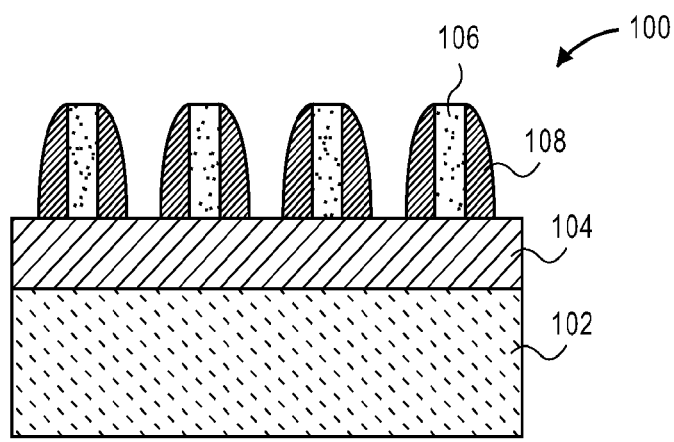
FIG. 1A illustrates a cross-sectional view of a starting structure following deposition, but prior to patterning, of a hardmask material layer formed on an interlayer dielectric (ILD) layer.
Figure 1B:
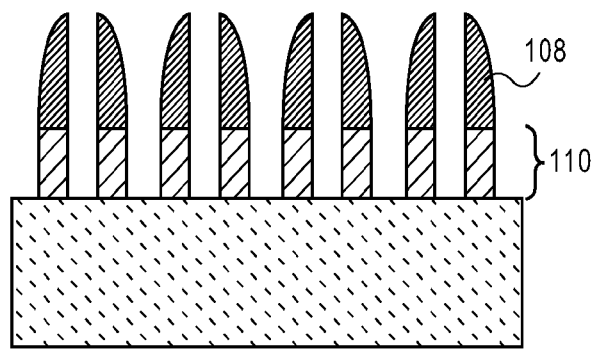
FIG. 1B illustrates a cross-sectional view of the structure of FIG. 1A following patterning of the hardmask layer by pitch halving.

As mentioned above, pitch division techniques can be used to increase a line density prior to using EBL to cut such lines. In a first example, pitch halving can be implemented to double the line density of a fabricated grating structure. FIG. 1A illustrates a cross-sectional view of a starting structure following deposition, but prior to patterning, of a hardmask material layer formed on an interlayer dielectric (ILD) layer. FIG. 1B illustrates a cross-sectional view of the structure of FIG. 1A following patterning of the hardmask layer by pitch halving.

Referring to FIG. 1A, a starting structure 100 has a hardmask material layer 104 formed on an interlayer dielectric (ILD) layer 102. A patterned mask 106 is disposed above the hardmask material layer 104. The patterned mask 106 has spacers 108 formed along sidewalls of features (lines) thereof, on the hardmask material layer 104.

Referring to FIG. 1B, the hardmask material layer 104 is patterned in a pitch halving approach. Specifically, the patterned mask 106 is first removed. The resulting pattern of the spacers 108 has double the density, or half the pitch or the features of the mask 106. The pattern of the spacers 108 is transferred, e.g., by an etch process, to the hardmask material layer 104 to form a patterned hardmask 110, as is depicted in FIG. 1B. In one such embodiment, the patterned hardmask 110 is formed with a grating pattern having unidirectional lines. The grating pattern of the patterned hardmask 110 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 110 of FIG. 1B may have hardmask lines spaced at a constant pitch and having a constant width relative to one another. The dimensions achieved may be far smaller than the critical dimension of the lithographic technique employed.

Accordingly, as a first portion of a CEBL integration scheme, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented.

Figure 2:
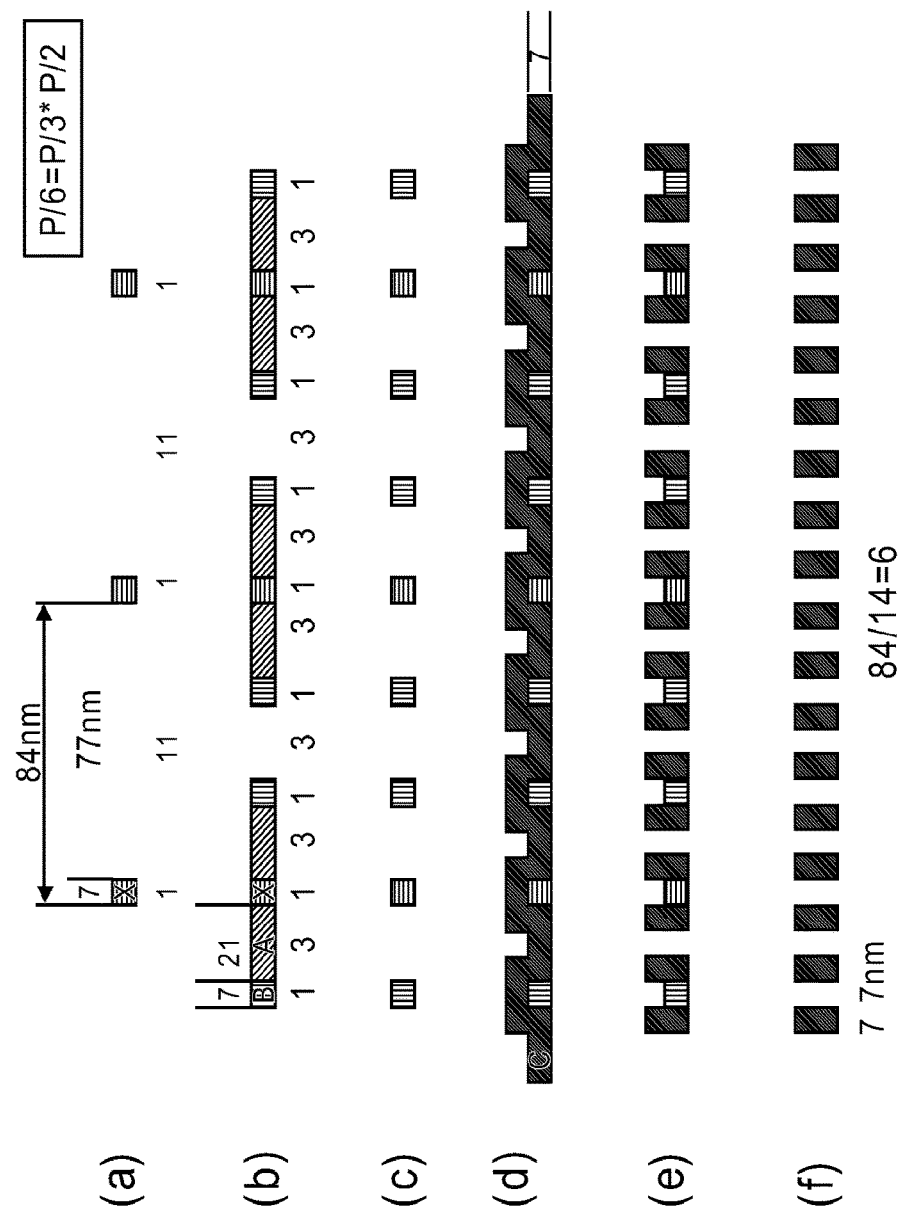
FIG. 2 illustrates cross-sectional views in a spacer-based-sextuple-patterning (SBSP) processing scheme which involves pitch division by a factor of six.

For example, FIG. 2 illustrates cross-sectional views in a spacer-based-sextuple-patterning (SBSP) processing scheme which involves pitch division by a factor of six. Referring to FIG. 2, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

Figure 3:
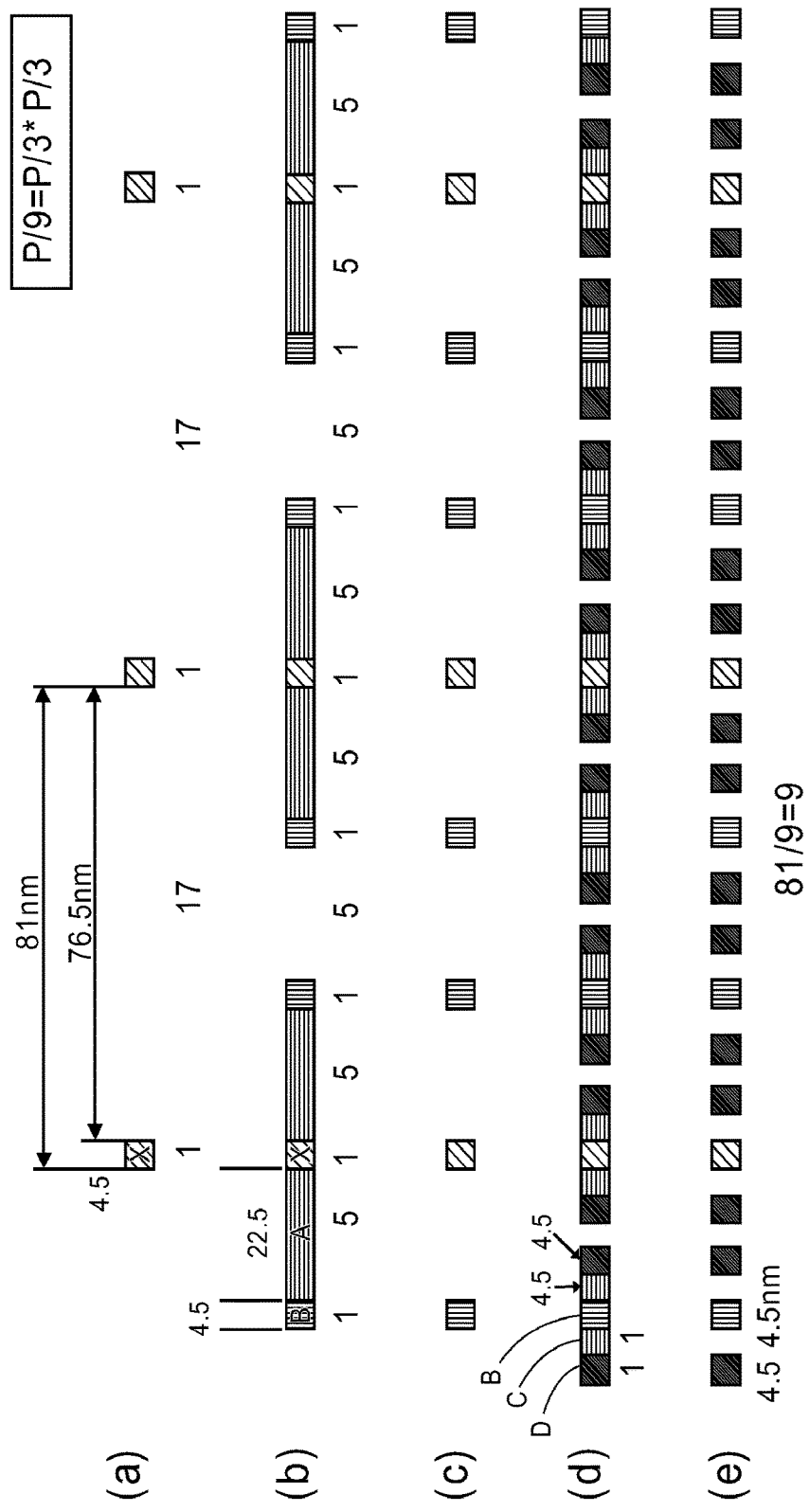
FIG. 3 illustrates cross-sectional views in a spacer-based-nonuple-patterning (SBNP) processing scheme which involves pitch division by a factor of nine.

In another example, FIG. 3 illustrates cross-sectional views in a spacer-based-nonuple-patterning (SBNP) processing scheme which involves pitch division by a factor of nine. Referring to FIG. 3, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C and D deposition and etch. At operation (e), a pitch/9 pattern is achieved following spacer C removal.

In any case, in an embodiment, complementary lithography as described herein involves first fabricating a gridded layout by conventional or state-of the-art lithography, such as 193 nm immersion lithography (193i). Pitch division may be implemented to increase the density of lines in the gridded layout by a factor of n. Gridded layout formation with 193i lithography plus pitch division by a factor of n can be designated as 193i+P/n Pitch Division. Patterning of the pitch divided gridded layout may then be patterned using electron beam direct write (EBDW) "cuts," as is described in greater detail below. In one such embodiment, 193 nm immersion scaling can be extended for many generations with cost effective pitch division. Complementary EBL is used to break gratings continuity and to pattern vias.

More specifically, embodiments described herein are directed to patterning features during the fabrication of an integrated circuit. In one embodiment, CEBL is used to pattern openings for forming vias. Vias are metal structures used to electrically connect metal lines above the vias to metal lines below the vias. In another embodiment, CEBL is used to form non-conductive spaces or interruptions along the metal lines. Conventionally, such interruptions have been referred to as "cuts" since the process involved removal or cutting away of portions of the metal lines. However, in a damascene approach, the interruptions may be referred to as "plugs" which are regions along a metal line trajectory that are actually not metal at any stage of the fabrication scheme, but are rather preserved regions where metal cannot be formed. In either case, however, use of the terms cuts or plugs may be done so interchangeably. Via opening and metal line cut or plug formation is commonly referred to as back end of line (BEOL) processing for an integrated circuit. In another embodiment, CEBL is used for front end of line (FEOL) processing. For example, the scaling of active region dimensions (such as fin dimensions) and/or associated gate structures can be performed using CEBL techniques as described herein.

As described above, electron beam (ebeam) lithography may be implemented to complement standard lithographic techniques in order to achieved desired scaling of features for integrated circuit fabrication. An electron beam lithography tool may be used to perform the ebeam lithography. In an exemplary embodiment, FIG. 4 is a cross-sectional schematic representation of an ebeam column of an electron beam lithography apparatus.

Figure 4:
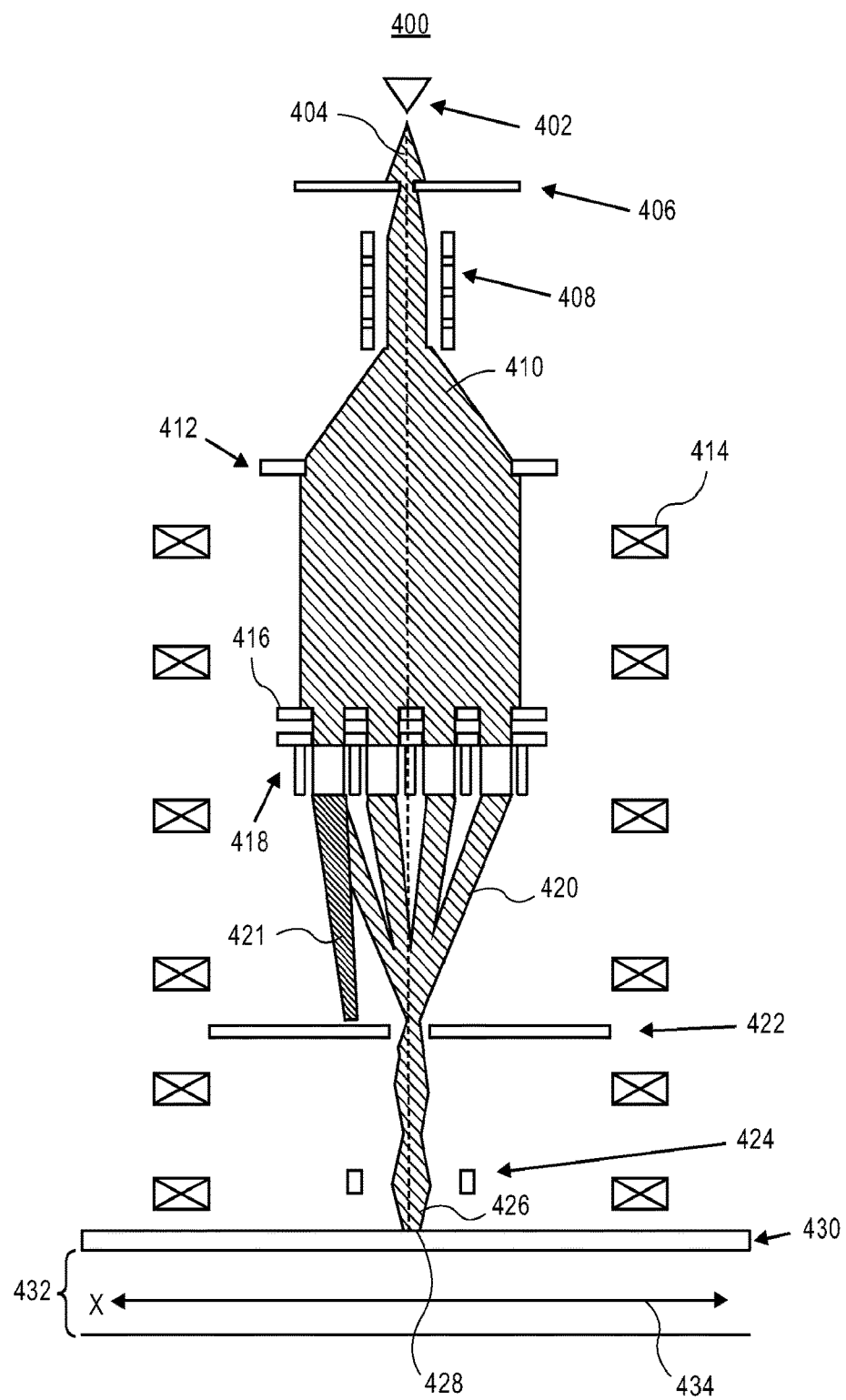
FIG. 4 is a cross-sectional schematic representation of an ebeam column of an electron beam lithography apparatus.

Referring to FIG. 4, an ebeam column 400 includes an electron source 402 for providing a beam of electrons 404. The beam of electrons 404 is passed through a limiting aperture 406 and, subsequently, through high aspect ratio illumination optics 408. The outgoing beam 410 is then passed through a slit 412 and may be controlled by a slim lens 414, e.g., which may be magnetic. Ultimately, the beam 404 is passed through a shaping aperture 416 (which may be a one-dimensional (1-D) shaping aperture) and then through a blanker aperture array (BAA) 418. The BAA 418 includes a plurality of physical apertures therein, such as openings formed in a thin slice of silicon. It may be the case that only a portion of the BAA 418 is exposed to the ebeam at a given time. Alternatively, or in conjunction, only a portion 420 of the ebeam 404 that passes through the BAA 418 is allowed to pass through a final aperture 422 (e.g., beam portion 421 is shown as blocked) and, possibly, a stage feedback deflector 424.

Referring again to FIG. 4, the resulting ebeam 426 ultimately impinges as a spot 428 on a surface of a wafer 430, such as a silicon wafer used in IC manufacture. Specifically, the resulting ebeam may impinge on a photoresist layer on the wafer, but embodiments are not so limited. A stage scan 432 moves the wafer 430 relative to the beam 426 along the direction of the arrow 434 shown in FIG. 4. It is to be appreciated that an ebeam tool in its entirely may include numerous columns 400 of the type depicted in FIG. 4. Also, as described in some embodiments below, the ebeam tool may have an associated base computer, and each column may further have a corresponding column computer.

One drawback of state-of-the-art e-beam lithography is that it is not readily adoptable into a high volume manufacturing (HVM) environment for advanced integrated circuit manufacturing. Today's e-beam tooling and associated methodology has proven to be too slow with respect to throughput requirements for HVM wafer processing. Embodiments described herein are directed to enabling the use of EBL in an HVM environment. In particular, many embodiments described herein enable improved throughput in an EBL tool to allow for the use of EBL in an HVM environment.

Described below are seven different aspects of embodiments that can improve EBL beyond its current capabilities. It is to be appreciated that, although broken out as seven distinct aspects of embodiments, embodiments described below may be used independently or in any suitable combination to achieve improvements in EBL throughput for an HVM environment. As described in greater detail below, in a first aspect, alignment considerations for a wafer subjected to ebeam patterning on an ebeam tool are addressed. In a second aspect, data compression or data reduction for ebeam tool simplification is described. In a third aspect, the implementation of regions of uniform metal or other grating pattern density for an integrated circuit layout is described. In a fourth aspect, a staggered blanker aperture array (BAA) for an ebeam tool is described. In a fifth aspect, a three beam aperture array for an ebeam tool is described. In a sixth aspect, a non-universal cutter for an ebeam tool is described. In a seventh aspect, a universal cutter for an ebeam tool is described.

For all aspects, in an embodiment, when referring below to openings or apertures in a blanker aperture array (BAA), all or some of the openings or apertures of the BAA can be switched open or "closed" (e.g., by beam deflecting) as the wafer/die moves underneath along a wafer travel or scan direction. In one embodiment, the BAA can be independently controlled as to whether each opening passes the ebeam through to the sample or deflects the beam into, e.g., a Faraday cup or blanking aperture. The ebeam column or apparatus including such a BAA may be built to deflect the overall beam coverage to just a portion of the BAA, and then individual openings in the BAA are electrically configured to pass the ebeam ("on") or not pass ("off"). For example, un-deflected electrons pass through to the wafer and expose a resist layer, while deflected electrons are caught in the Faraday cup or blanking aperture. It is to be appreciated that reference to "openings" or "opening heights" refers to the spot size impinged on the receiving wafer and not to the physical opening in the BAA since the physical openings are substantially larger (e.g., micron scale) than the spot size (e.g., nanometer scale) ultimately generated from the BAA. Thus, when described herein as the pitch of a BAA or column of openings in a BAA being said to "correspond" to the pitch of metal lines, such description actually refers to the relationship between pitch of the impinging spots as generated from the BAA and the pitch of the lines being cut. As an example provided below, the spots generated from the BAA 2110 have a pitch the same as the pitch of the lines 2100 (when both columns of BAA openings are considered together). Meanwhile, the spots generated from only one column of the staggered array of the BAA 2110 have twice the pitch as the pitch of the lines 2100.

For all aspects, it is also to be appreciated that, in some embodiments, an ebeam column as described above may also include other features in addition to those described in association with FIG. 4. For example, in an embodiment, the sample stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage. Other additional embodiments are described below in association with FIGS. 24A-24C.

In a first aspect of embodiments of the present invention, alignment considerations for a wafer subjected to ebeam patterning on an ebeam tool are addressed.

Approaches described below may be implemented to overcome excessive contribution to edge placement error (EPE) from layer to layer physical overlay when a layer is patterned by an imaging tool (e.g., an optical scanner). In an embodiment, the approaches described below are applicable for an imaging tool that otherwise uses preselected sampling of wafer coordinate system markers (i.e., alignment marks) to estimate wafer processing induced in-plane grid distortion parameters on a processed wafer. The collected alignment information (e.g., sampled wafer in plane grid distortion) is typically fit to a predefined order polynomial. The fit is then typically used as a representation of a distorted grid to adjust various scanner printing parameters and to achieve the best possible overlay between underlying and printed layers.

Instead, in an embodiment, use of an ebeam for patterning allows for collection of alignment information during a write at any point on the pattern ("align on the fly") containing underlying layer features, and not only on every die. For example, an electron detector is placed at the ebeam column bottom in order to collect backscattered electrons from alignment marks or other underlying patterned feature. A straight forward linear model allows for collection of such information hundreds of time within every die as an ebeam column writes (and the detector detects) while the stage is scanning underneath the column during die exposure. In one such embodiment, there is no need for fitting polynomial and estimating complex correction parameters of higher orders. Rather, only simple linear corrections can be used.

In an embodiment, in practice, multiple (hundreds) time positions of the ebeam can and will be registered against alignment marks patterned on a previous layer in scribe lines as well as inside active areas of the dies. The registering may be performed using drop in cells usually present for the purpose of characterizing patterning characteristics of a layer pattern to be exposed without loss of tool throughput of COO (cost of ownership).

In the case that on-the-fly alignment is not implemented, the alternative is to use higher order polynomials, as described above. However, alignment based on higher order polynomials is used to fit relatively sparse alignment information (e.g., only 10-15% of dies locations to be patterned are used to collect in-plane grid distortions on the wafer), whereas un-modeled (residual) fit errors constitute about 50% of maximum total overlay predicted errors. Collecting much more dense alignment information and using even higher order polynominal for fit and patterning correction might improve overlay somewhat yet this will be achieved at significant throughput and cost of ownership loss.

To provide context, wafer processing induced in-plane grid distortion occurs from multiple sources, including but not limited to backscatter/field displacement errors due to metal/other layers underneath the pattern being printed, wafer bowing/localized incremental wafer expansion due to pattern writing heat effects, and other additional effects that contribute greatly to EPE. If corrections are not made, the likelihood of patterning a wafer with localized gross patterning misalignment is very high.

Figure 5:
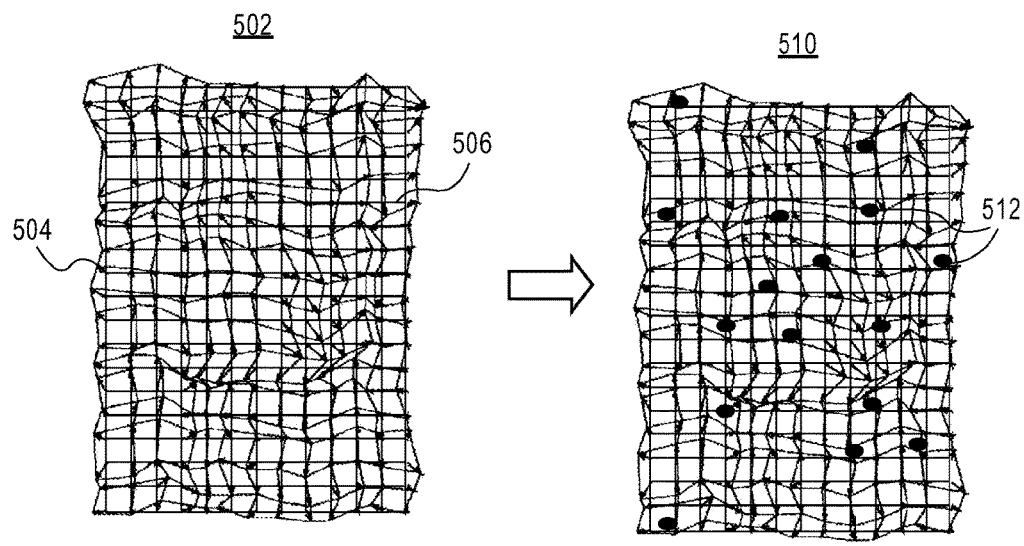
FIG. 5 is a schematic demonstrating an optical scanner overlay limited by its ability to model in plane grid distortions (IPGD).

FIG. 5 is a schematic demonstrating an optical scanner overlay limited by its ability to model in plane grid distortions (IPGD). Referring to the left-hand portion 502 of FIG. 5, a die grid 504 on a wafer 506 is distorted by wafer processing. Vectors indicate corners displacement of every die versus the initial positioning (e.g., first layer print). Referring to the right-hand portion 510 of FIG. 5, a conventional stepper will collect relatively sparse distorted grid information on this layer, as represented by the dots 512. Accordingly, using higher order polynomials allows fitting of relatively sparse alignment information. The number of locations is optimized for "acceptable" residuals after the model fits to grid representation obtained from grid coordinate information in the sampled locations. Overhead time is needed to collect this information.

Figure 6:
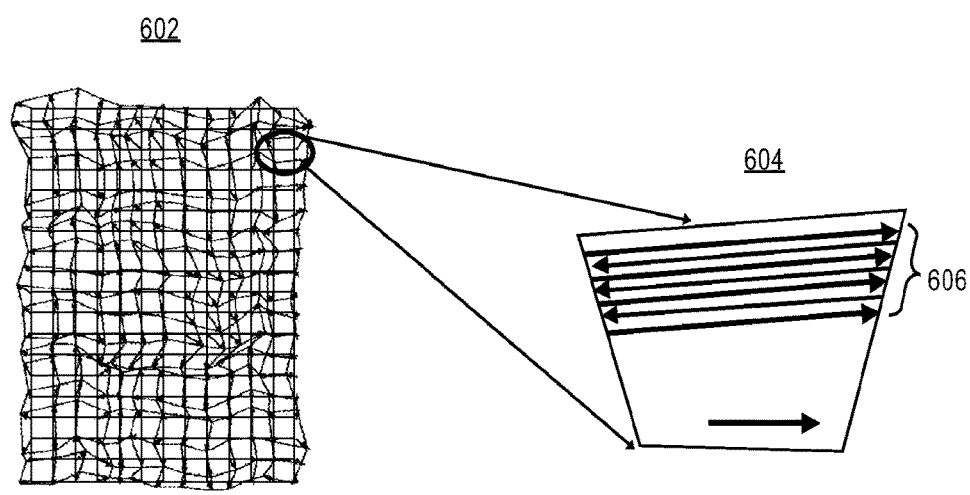
FIG. 6 is a schematic demonstrating distorted grid information using an align on the fly approach, in accordance with an embodiment of the present invention.

In contrast to the relatively sparse distorted grid information collected as represented in FIG. 5, FIG. 6 is a schematic demonstrating distorted grid information using an align on the fly approach, in accordance with an embodiment of the present invention. Referring to FIG. 6, as an ebeam writes every die, the detector at the column bottom collects information about positional coordinated of an underlying layer. Necessary adjustment to writing position can be performed through stage position control in real time everywhere on the wafer at no or minimal overhead time increase or throughput loss. In particular, FIG. 6 illustrates the same plot 602 as provided in FIG. 5. A zoomed-in exemplary die region 604 illustrates the scanning directions 606 within the die region 604.

In a second aspect of embodiments of the present invention, data compression or data reduction for ebeam tool simplification is described.

Approaches described herein involve restricting data to allow massive compression of data, reducing a data path and ultimately providing for a much simpler ebeam writing tool. More particularly, embodiments described enable significant reduction in the amount of data that must be passed to an ebeam column of an ebeam tool. A practical approach is provided for allowing a sufficient amount of data to write the column field and adjust the column field for field edge placement error, while keeping within the electrical bandwidth limits of the physical hardware. Without implementing such embodiments, the required bandwidth is approximately 100 times that possible by today's electronics. In an embodiment, data reduction or compression approaches described herein can be implemented to substantially increase throughput capabilities of an EBL tool. By increasing the throughput capabilities, EBL can more readily be adopted in an HVM environment, such as into an integrated circuit manufacturing environment.

FIG. 7 provides a sample calculation showing the information to be transferred to pattern a general/conventional layout at 50% density on a 300 mm wafer in contrast to a via pattern at 5% density, in accordance with an embodiment of the present invention. Referring to FIG. 7, information to be transferred is according to equation (A). Information transfer is according to equation (B) with information loss due to edge placement error (EPE) uncertainty (Ap) is minimal resolved feature, and ΔPV is equal to 2EPE. Assuming EBDW tool resolution of AP is equal to 10 nm and EPE is equal to 2.5 nm, the information volume to be transferred by such a general purpose imaging system in 1 $m^2$ (assuming 50% pattern density) will be according to equation (C). A 300 mm wafer area is 706 $cm^2$ which is 0.0706 $m^2$. Correspondingly, to pattern a general layout at 50% density on a 300 mm wafer, the number of bytes needed to be transferred is according to equation (D). The result is 70 TB to be transferred in 6 minutes assuming 10 wph TPT for a transfer rate of 194.4 GB/s. In accordance with an embodiment of the present invention, an EBDW tool that is designed to print vias (and/or cuts) at a pattern density of approximately 10% will require correspondingly smaller information to be transferred, e.g., at a realistic 40 GB/s transfer rate. In a specific embodiment, an EBDW tool is designed to print vias (and/or cuts) at a pattern density of approximately 5% and requires correspondingly smaller information to be transferred, e.g., 7 TB at a realistic 20 GB/s transfer rate.

With reference again to FIG. 7, the information transfer is reduced to a relative (integerized) distance instead of transferring absolute 64 bit coordinates. By using an ebeam tool to pattern only vias at less than approximately 10% density, and even as low as 5% density, versus a general layout pattern at 50% density, for example, a reduction in the amount of data transfer from 70+TB in 6 minutes to less than 7 TB in 6 minutes can be realized, allowing the ebeam apparatus to achieve the manufacturing throughput needed for high volume production.

In an embodiment, one or more of the following four approaches is implemented for data reduction: (1) all design rules for vias and cuts are simplified to reduce the number of positions that a via can occupy, and where the start and stop of a line cut is possibly located; (2) encryption of placement of cut starts and stops, as well as distances between vias, is encrypted as n*min distance (this removes the need to send 64 bit address for each start and stop location for a cut, as well as for via locations); (3) for each column in the tool, only the data required to make the cuts and vias that fall within this section of the wafer are forwarded to the column computer (each column receives only the data needed, in a form encrypted as in part 2); and/or (4) for each column in the tool, the area that is transmitted is increased by n lines at top, bottom and additional breadth in x is also allowed (accordingly, the associated column computer can adjust on the fly for changes in wafer temperature and alignment without having the entire wafer data transmitted). In an embodiment, implementation of one or more such data reduction approaches enables simplification of an ebeam tool at least to some extent. For example, a dedicated computer or processor normally associated with a single dedicated column in a multi-column ebeam tool may be simplified or even altogether eliminated. That is, a single column equipped with on-board dedicated logic capability may be simplified to move the logic capability off-board or to reduce to amount of on-board logic capability required for each individual column of the ebeam tool.

Figure 8:
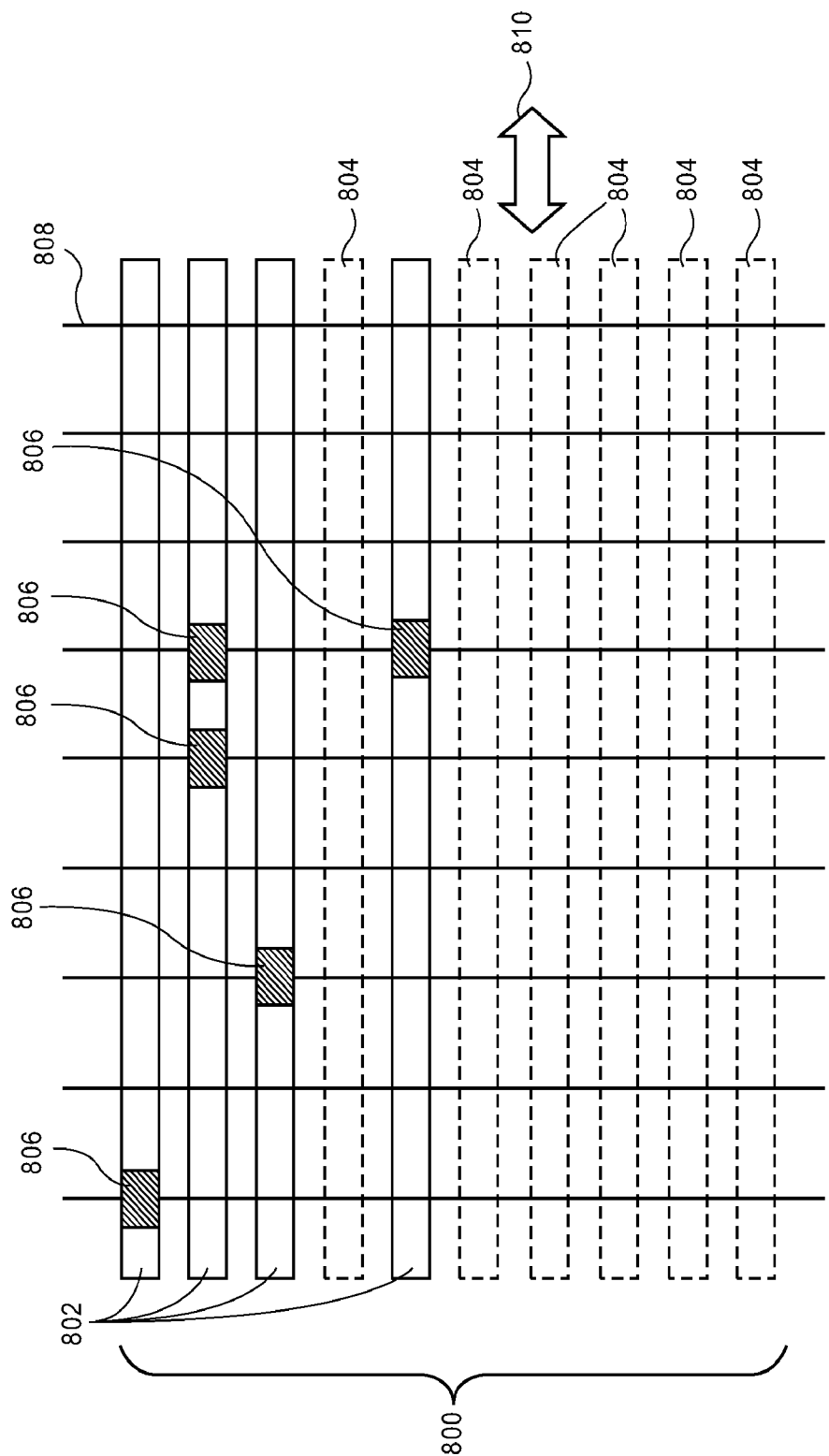
FIG. 8 illustrates a gridded layout approach for simplified design rule locations for vias, and cut start/stop, in accordance with an embodiment of the present invention.

With respect to approach (1) above, FIG. 8 illustrates a gridded layout approach for simplified design rule locations for vias, and cut start/stop, in accordance with an embodiment of the present invention. A horizontal grid 800 includes a regular arrangement of line positions, with solid lines 802 representing actual lines and dashed lines 804 representing unoccupied line positions. The key to this technique is that vias (filled-in boxes 806) are on a regular grid (shown as the vertical grid 808 in FIG. 8) and are printed in the scan direction 810 parallel with the metal lines (horizontal rectangles with solid outline) that are below the vias. The requirement for this design system is that via locations 806 are formed only in alignment with the vertical grid 808.

Figure 9:
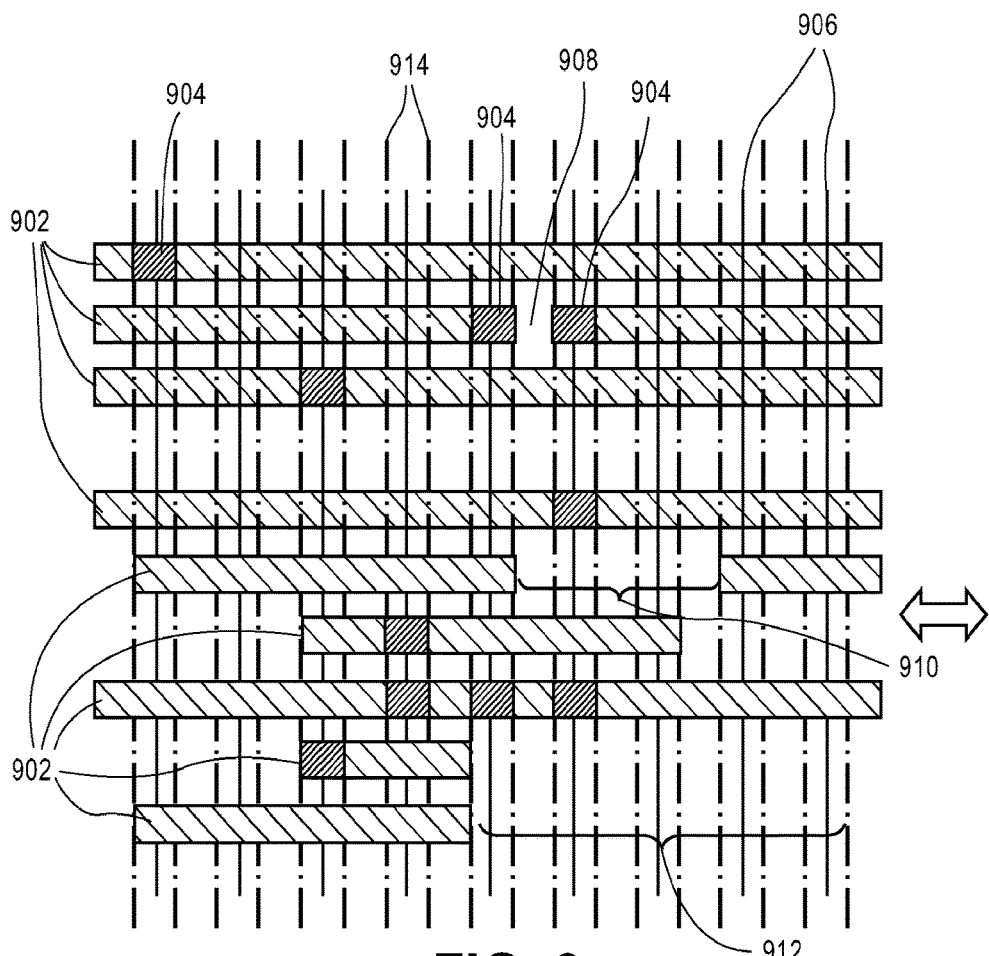
FIG. 9 illustrates the allowable placement of cuts, in accordance with an embodiment of the present invention.

With respect to cuts, cuts are made with a grid that is finer than the via grid. FIG. 9 illustrates the allowable placement of cuts, in accordance with an embodiment of the present invention. Referring to FIG. 9, an array of lines 902 has vias 904 positioned therein according to grid 906. The allowable placement of cuts (e.g., labeled cuts 908, 910 and 912) is indicated by the vertical dashed lines 914, with the via locations continuing as vertical solid lines 906. The cuts always start, and stop, exactly on the grid 914, which is key to reducing the amount of data transferred from the base computer down to the column computer. It is to be appreciated, however, that the position of the dashed vertical lines 914 appears to be a regular grid, but that is not a requirement. Instead, the pair of lines centered around the via cut lines is the known distance of −xn and +xn relative to the via location. The via locations are a regular grid that is spaced every m units along the cut direction.

With respect to approach (2) above, distance-based encryption of cuts and vias may be used to eliminate the need to send 64 bit full addresses. For example, rather than sending absolute 64 bit (or 128 bit) addresses for x, and y positions, the distance along the direction of travel from the left edge (for wafer lines printing in direction moving to right) or from the right edge (for wafer lines printing in the direction moving to the left) is encrypted. The pair of lines centered around the via lines is the known distance of −xn and +xn relative to the via location, and the via locations are a regular grid that is spaced every m units along the cut direction. Any via print location can thus be encrypted as a distance from zero to the numbered via location (spaced m units apart). This significantly reduces the amount of positioning data that must be transmitted.

Figure 10:
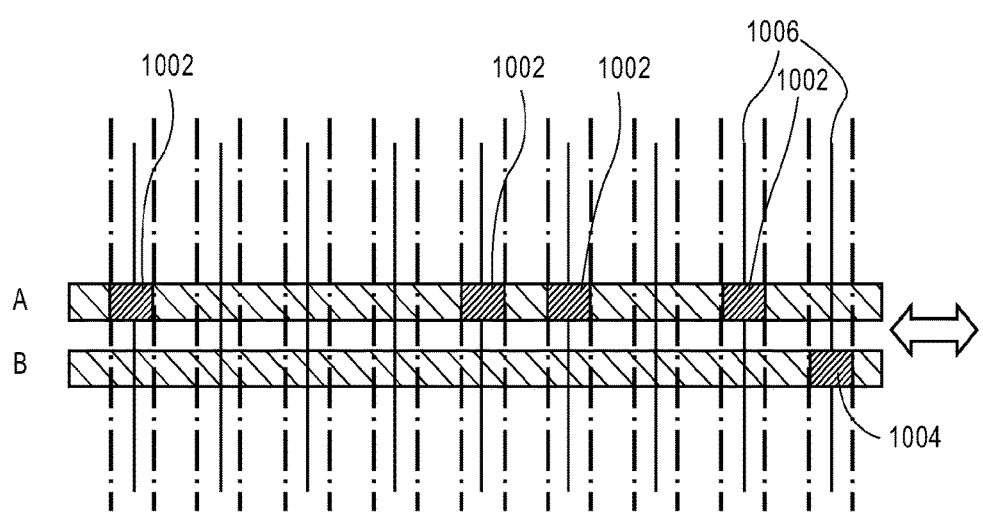
FIG. 10 illustrates a via layout among lines A and B, in accordance with an embodiment of the present invention.

The amount of information can be further reduced by providing the machine with the relative count of vias from the previous via. FIG. 10 illustrates a via layout among lines A and B, in accordance with an embodiment of the present invention. Referring to FIG. 10, the two lines as shown can be reduced as follows: line A: via 1002 spacing +1, +4, +1, +2; line B: via 1004 spacing +9. The via 1002/1004 spacing is according to grid 1006. It is to be appreciated that additional communication theory of assignment of most likely terms could be further performed to reduce the data space. Even so, even ignoring such further reduction yields an excellent improvement using straight forward compression to reduce 4 vias of 64 bits position, to just a handful of bits.

Figure 11:
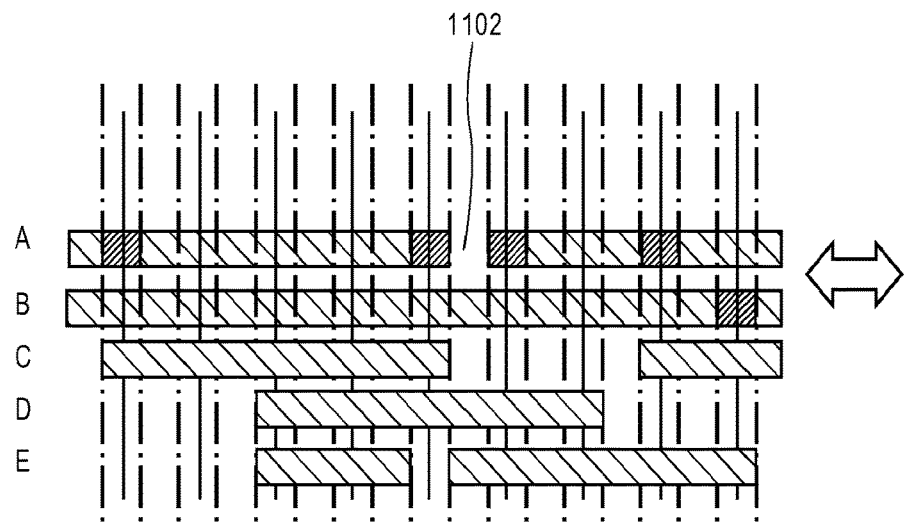
FIG. 11 illustrates a cut layout among lines A-E, in accordance with an embodiment of the present invention.

Similarly, the start and stop of cuts can be reduced to eliminate the need to send 64 bits (or 128 bits) of positional information for each cut. Like a light switch, starting a cut means the next data point is the end of cut, and similarly the next location is the start of the next cut. Since it is known that cuts end +xn in the direction of travel from via locations (and similarly start at −xn), depending upon cut start/stop, the via location can be encoded and the local column computer can be instructed reapply the offset from the via location. FIG. 11 illustrates a cut layout among lines A-E, in accordance with an embodiment of the present invention. Referring to FIG. 11, a substantial decrease over sending absolute 64 (or 128) bit locations results: spacing from previous cut: A: +5 (shown as space 1102), +1; B: x <no cuts> (whatever x is encrypted as—no cuts for distance); C: +1 (the stopping point of the cut at the left), +4 (the start of the large cut aligned vertically with the start of cut 1102) +3 (the end of the large cut); D: +3, +4; E: +3, +2, +1, +4.

Figure 12:
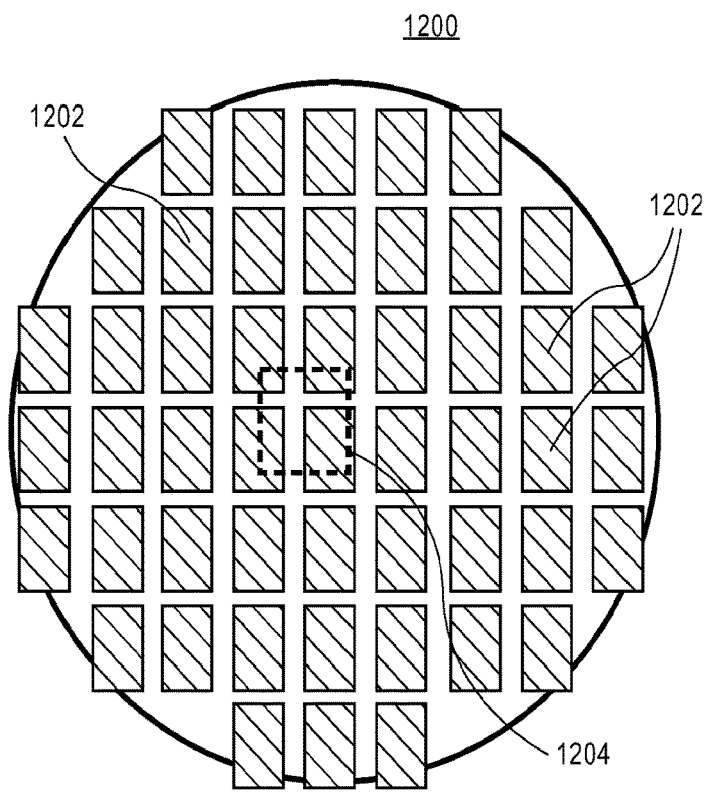
FIG. 12 illustrates a wafer having a plurality of die locations thereon and an overlying dashed box representing a wafer field of a single column, in accordance with an embodiment of the present invention.

With respect to approach (3) above, for each column, the data transmitted for cuts and vias is restricted to just that required for the wafer field that falls under the given column. In an example, FIG. 12 illustrates a wafer 1200 having a plurality of die locations 1202 thereon and an overlying dashed box 1204 representing a wafer field of a single column, in accordance with an embodiment of the present invention. Referring to FIG. 12, the data transmitted to the local column computer is limited to only the lines that occur in the printed region shown in dotted lines of box 1204.

Figure 13:
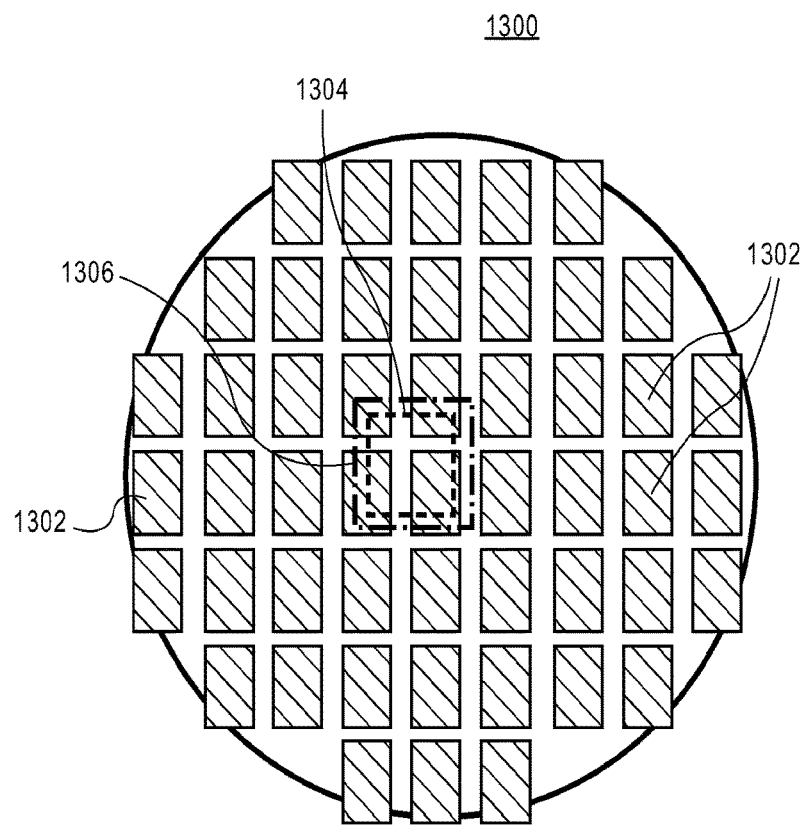
FIG. 13 illustrates a wafer having a plurality of die locations thereon and an overlying actual target wafer field of a single column and increased peripheral area for on the fly correction, in accordance with an embodiment of the present invention.

With respect to approach (4) above, since correction for wafer bow, heating, and chuck misalignment by an angle theta must be done on the fly, the actual region transmitted to the column computer is a few lines larger top and bottom, as well as additional data to the left and right. FIG. 13 illustrates a wafer 1300 having a plurality of die locations 1302 thereon and an overlying actual target wafer field 1304 of a single column. As shown in FIG. 13, an increased peripheral area 1306 is provided to account for on the fly correction, in accordance with an embodiment of the present invention. Referring to FIG. 13, while the increased peripheral area 1306 slightly increases the amount of data transmitted to the column computer, it also allows the column printing to correct for wafer misalignment resulting from a myriad of issues by allowing the column to print outside its normal region. Such issues may include wafer alignment issues or local heating issues, etc.

Figure 14:
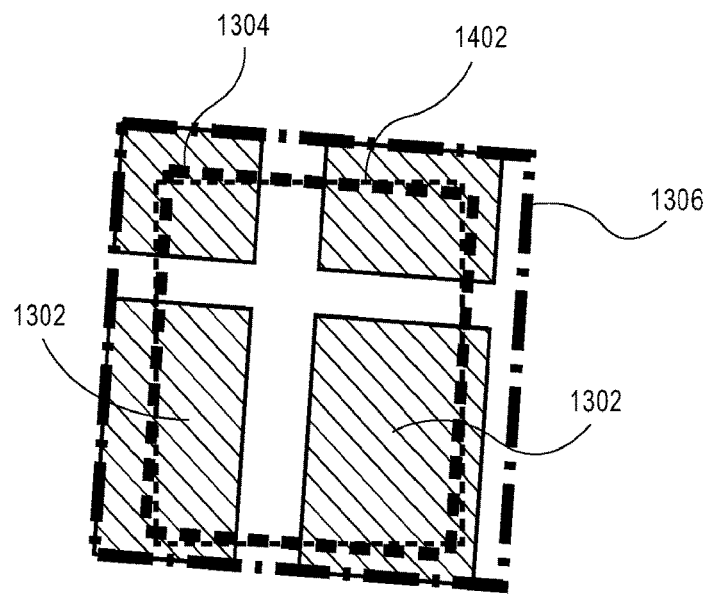
FIG. 14 demonstrates the effect of a few degree wafer rotation on the area to be printed (inner dark, thin dashed) against the original target area (inner light, thick dashed), in accordance with an embodiment of the present invention.

FIG. 14 demonstrates the effect of a few degree wafer rotation on the area to be printed (inner dark, thin dashed box 1402) against the original target area (inner light, thick dashed box 1304) from FIG. 13, in accordance with an embodiment of the present invention. Referring to FIG. 14, the column computer is able to use the additional transmitted data to make the necessary printing changes without requiring a complex rotational chuck on the machine (which would otherwise limit the speed of the printing).

In a third aspect of embodiments of the present invention, the implementation of regions of uniform metal or other grating pattern density for an integrated circuit layout is described.

In an embodiment, in order to improve throughput of an ebeam apparatus, design rules for interconnect layers are simplified to enable a fixed set of pitches that can be used for logic, SRAM, and Analog/IO regions on the die. In one such embodiment, the metal layout further requires that the wires be unidirectional with no jogs, orthogonal direction wires, or hooks on the ends, as is currently used to enable via landings in conventional, non-ebeam lithography processes.

In a particular embodiment, three different wire widths of unidirectional wire are permitted within each metallization layer. Gaps in the wires are cut precisely, and all to the vias are self-aligned to a maximum allowed size. The latter is an advantage in minimizing via resistance for extremely fine pitch wiring. The approach described herein permits an efficient ebeam line cut and via printing with ebeam that achieves orders of magnitude improvement over existing ebeam solutions.

Figure 15:
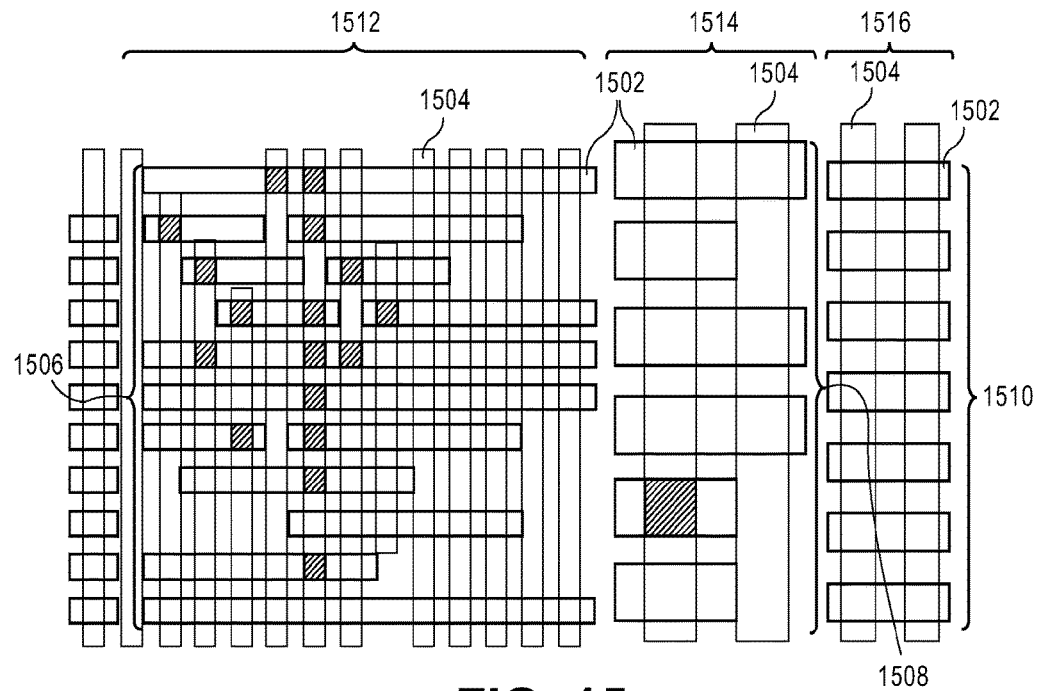
FIG. 15 illustrates a plan view of horizontal metal lines as represented overlaying vertical metal lines in the previous metallization layer, in accordance with an embodiment of the present invention.

FIG. 15 illustrates a plan view of horizontal metal lines 1502 as represented overlaying vertical metal lines 1504 in the previous metallization layer, in accordance with an embodiment of the present invention. Referring to FIG. 15, three different pitch/widths 1506, 1508 and 1510 of wires are permitted. The different line types may be segregated into chip regions 1512, 1514 and 1516, respectively, as shown. It is to be appreciated that regions are generally larger than shown, but to draw to scale would make the detail on the wires comparatively small. Such regions on the same layer may be fabricated first using conventional lithography techniques.

The advances described in embodiments herein permit precise wire trimming and fully self-aligned vias between layers. It is to be appreciated that trims occur as needed with no trim-trim (plug) rules required as in current litho-based processes. Furthermore, in an embodiment, via-via rules are significantly removed. Vias of the density and relationship shown would be difficult or impossible to print using current optical proximity correction (OPC)-enabled lithography capability. Similarly, the plug/cut rules that would otherwise preclude some of the cuts shown are removed through use of this technique. As such, the interconnect/via layers are less limiting to the design of circuits.

Figure 16:
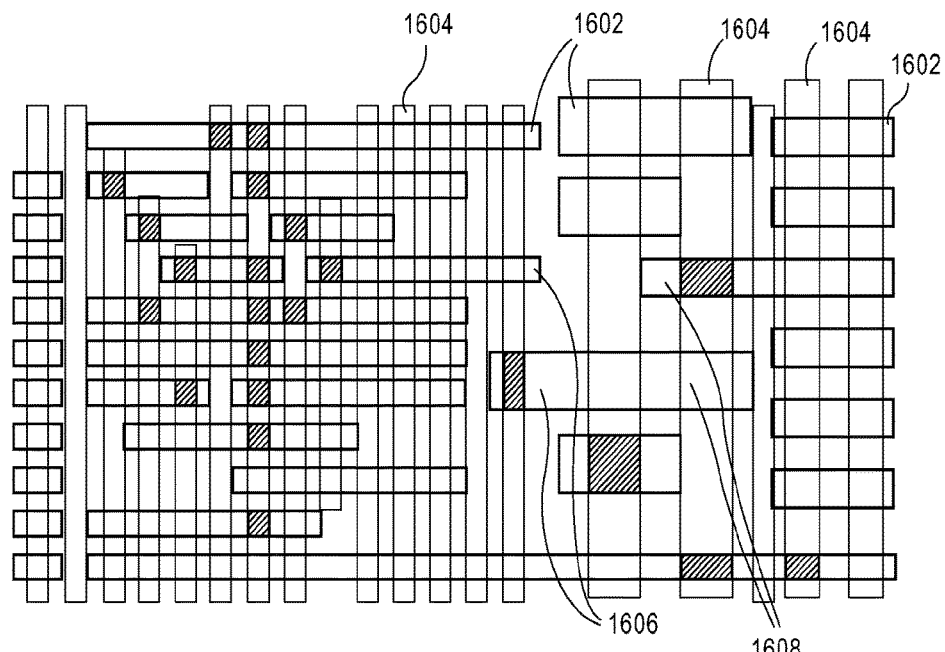
FIG. 16 illustrates a plan view of horizontal metal lines as represented overlaying vertical metal lines in the previous metallization layer, where metal lines of differing width/pitch overlap in a vertical direction, in accordance with an embodiment of the present invention.

Referring again to FIG. 15, in the vertical direction, lines of different pitches and widths are not overlapping, i.e., each region is segregated in a vertical direction. By contrast, FIG. 16 illustrates a plan view of horizontal metal lines 1602 as represented overlaying vertical metal lines 1604 in the previous metallization layer, where metal lines of differing width/pitch overlap in a vertical direction, in accordance with an embodiment of the present invention. For example, lines pair 1606 overlap in the vertical direction, and lines pair 1608 overlap in the vertical direction. Referring again to FIG. 16, the regions may be fully overlapping. The wires of all three sizes may be interdigitated, if enabled by the lines fabrication method, yet cuts and vias continue to be fully enabled by a universal cutter, as described below in association with another aspect of embodiments of the present invention.

Figure 17:
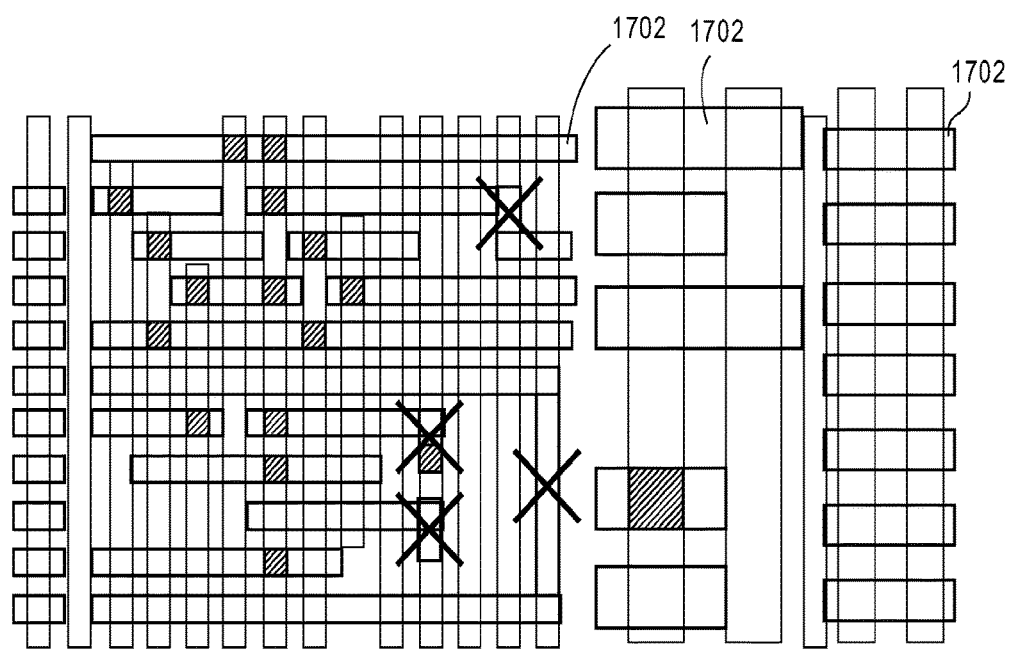
FIG. 17 illustrates a plan view of conventional metal lines as represented overlaying vertical metal lines in the previous metallization layer.

To provide context, FIG. 17 illustrates a plan view of conventional metal lines 1702 as represented overlaying vertical metal lines in the previous metallization layer. Referring to FIG. 17, in contrast to the layouts of FIGS. 15 and 16, bi-directional wires are used conventionally. Such wiring adds orthogonal wiring in the form of long orthogonal wires, short jogs between tracks to change lanes, and "hooks" at the ends of wires to place a via such that line pullback does not encroach the vias. Examples of such constructs are shown at the X positions in FIG. 17. It could be argued that allowance of such orthogonal constructs provides some small density advantage (particularly the track jog at the upper X), but these significantly add design rule complexity/design rule checking as well as preclude a tool such as the ebeam methodology from achieving needed throughput. Referring again to FIG. 17, it is to be appreciated that conventional OPC/lithography would preclude some of the vias shown on the left hand side from actually being fabricated.

In a fourth aspect of embodiments of the present invention, a staggered blanker aperture array (BAA) for an ebeam tool is described.

Figure 18:
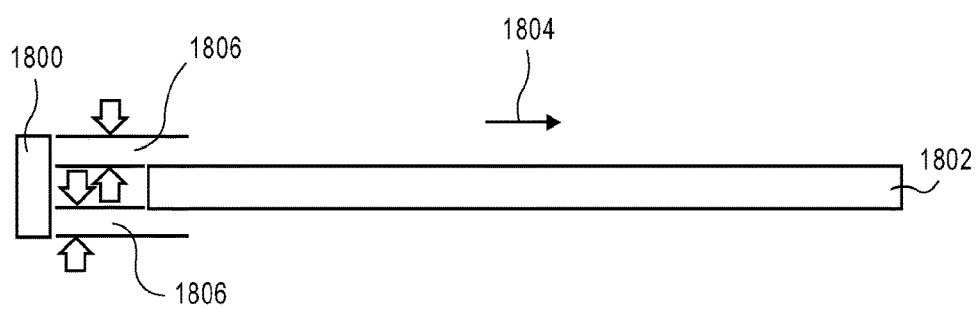
FIG. 18 illustrates an aperture (left) of a BAA relative to a line (right) to be cut or to have vias placed in targeted locations while the line is scanned under the aperture.

In an embodiment, a staggered beam aperture array is implemented to solve throughput of an ebeam machine while also enabling minimum wire pitch. With no stagger, consideration of edge placement error (EPE) means that a minimum pitch that is twice the wire width cannot be cut since there is no possibility of stacking vertically in a single stack. For example, FIG. 18 illustrates an aperture 1800 of a BAA relative to a line 1802 to be cut or to have vias placed in targeted locations while the line is scanned along the direction of the arrow 1804 under the aperture 1800. Referring to FIG. 18, for a given line 1802 to be cut or vias to be placed, the EPE 1806 of the cutter opening (aperture) results in a rectangular opening in the BAA grid that is the pitch of the line.

Figure 19:
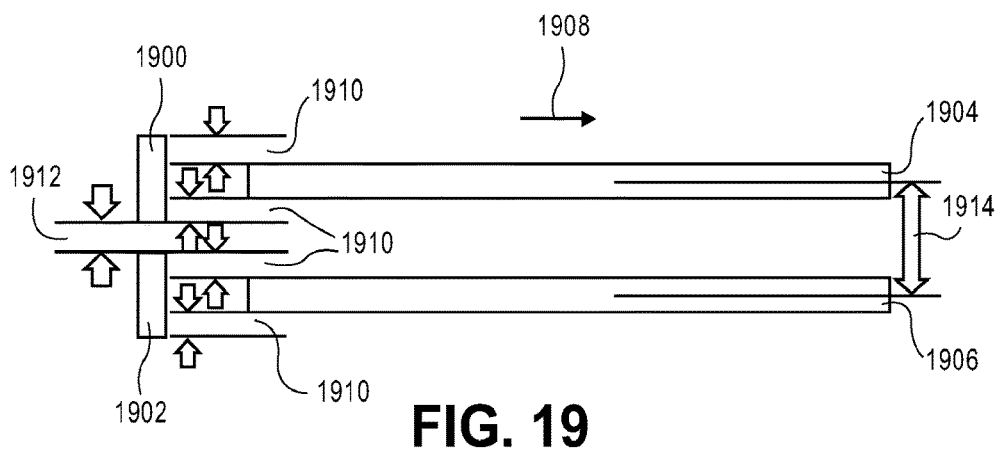
FIG. 19 illustrates two non-staggered apertures (left) of a BAA relative to two lines (right) to be cut or to have vias placed in targeted locations while the lines are scanned under the apertures.

FIG. 19 illustrates two non-staggered apertures 1900 and 1902 of a BAA relative to two lines 1904 and 1906, respectively, to be cut or to have vias placed in targeted locations while the lines are scanned along the direction of the arrow 1908 under the apertures 1900 and 1902. Referring to FIG. 19, when the rectangular opening 1800 of FIG. 18 is placed in a vertical single column with other such rectangular openings (e.g., now as 1900 and 1902), the allowed pitch of the lines to be cut is limited by 2×EPE 1910 plus the distance requirement 1912 between the BAA opens 1900 and 1902 plus the width of one wire 1904 or 1906. The resulting spacing 1914 is shown by the arrow on the far right of FIG. 19. Such a linear array would severely limit the pitch of the wiring to be substantially greater than 3-4× of the width of the wires, which may be unacceptable. Another unacceptable alternative would be to cut tighter pitch wires in two (or more) passes with slightly offset wire locations; this approach could severely limit the throughput of the ebeam machine.

Figure 20:
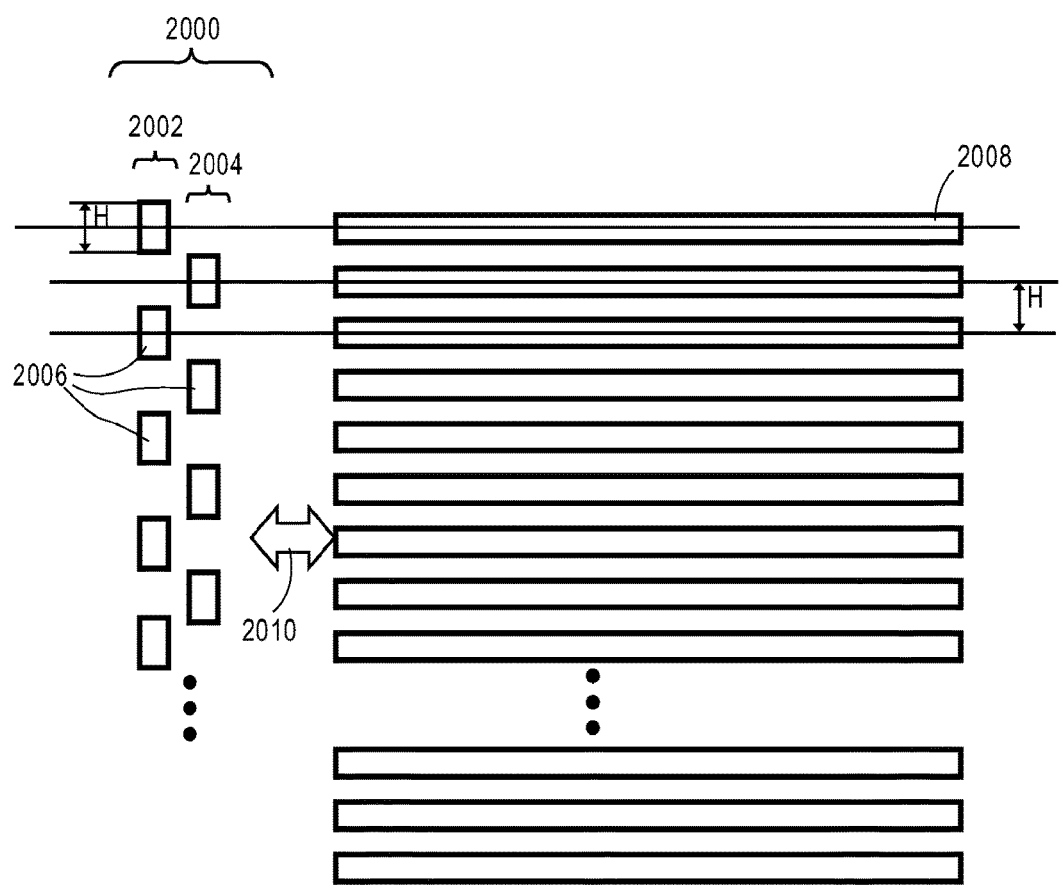
FIG. 20 illustrates two columns of staggered apertures (left) of a BAA relative to a plurality of lines (right) to be cut or to have vias placed in targeted locations while the lines are scanned under the apertures, with scanning direction shown by the arrow, in accordance with an embodiment of the present invention.

By contrast to FIG. 19, FIG. 20 illustrates two columns 2002 and 2004 of staggered apertures 2006 of a BAA 2000 relative to a plurality of lines 2008 to be cut or to have vias placed in targeted locations while the lines 2008 are scanned along the direction 2010 under the apertures 2006, with scanning direction shown by the arrow, in accordance with an embodiment of the present invention. Referring to FIG. 19, a staggered BAA 2000 includes two linear arrays 2002 and 2004, staggered spatially as shown. The two staggered arrays 2002 and 2004 cut (or place vias at) alternate lines 2008. The lines 2008 are, in one embodiment, placed on a tight grid at twice the wire width. As used throughout the present disclosure, the term staggered array can refer to a staggering of openings 2006 that stagger in one direction (e.g., the vertical direction) and either have no overlap or have some overlap when viewed as scanning in the orthogonal direction (e.g., the horizontal direction). In the latter case, the effective overlap provides for tolerance in misalignment.

It is to be appreciated that, although a staggered array is shown herein as two vertical columns for simplicity, the openings or apertures of a single "column" need not be columnar in the vertical direction. For example, in an embodiment, so long as a first array collectively has a pitch in the vertical direction, and a second array staggered in the scan direction from the first array collectively has the pitch in the vertical direction, the a staggered array is achieved. Thus, reference to or depiction of a vertical column herein can actually be made up of one or more columns unless specified as being a single column of openings or apertures. In one embodiment, in the case that a "column" of openings is not a single column of openings, any offset within the "column" can be compensated with strobe timing. In an embodiment, the critical point is that the openings or apertures of a staggered array of a BAA lie on a specific pitch in the first direction, but are offset in the second direction to allow them to place cuts or vias without any gap between cuts or vias in the first direction.

Thus, one or more embodiments are directed to a staggered beam aperture array where openings are staggered to allow meeting EPE cuts and/or via requirements as opposed to an inline arrangement that cannot accommodate for EPE technology needs. By contrast, with no stagger, the problem of edge placement error (EPE) means that a minimum pitch that is twice the wire width cannot be cut since there is no possibility of stacking vertically in single stack. Instead, in an embodiment, use of a staggered BAA enables much greater than 4000 times faster than individually ebeam writing each wire location. Furthermore, a staggered array allows a wire pitch to be twice the wire width. In a particular embodiment, an array has 4096 staggered openings over two columns such that EPE for each of the cut and via locations can be made. It is to be appreciated that a staggered array, as contemplated herein, may include two or more columns of staggered openings.

In an embodiment, use of a staggered array leaves space for including metal around the apertures of the BAA which contain one or two electrodes for passing or steering the ebeam to the wafer or steering to a Faraday cup or blanking aperture. That is, each opening may be separately controlled by electrodes to pass or deflect the ebeam. In one embodiment, the BAA has 4096 openings, and the ebeam apparatus covers the entire array of 4096 openings, with each opening electrically controlled. Throughput improvements are enabled by sweeping the wafer under the opening as shown by the thick black arrows.

Figure 21A:
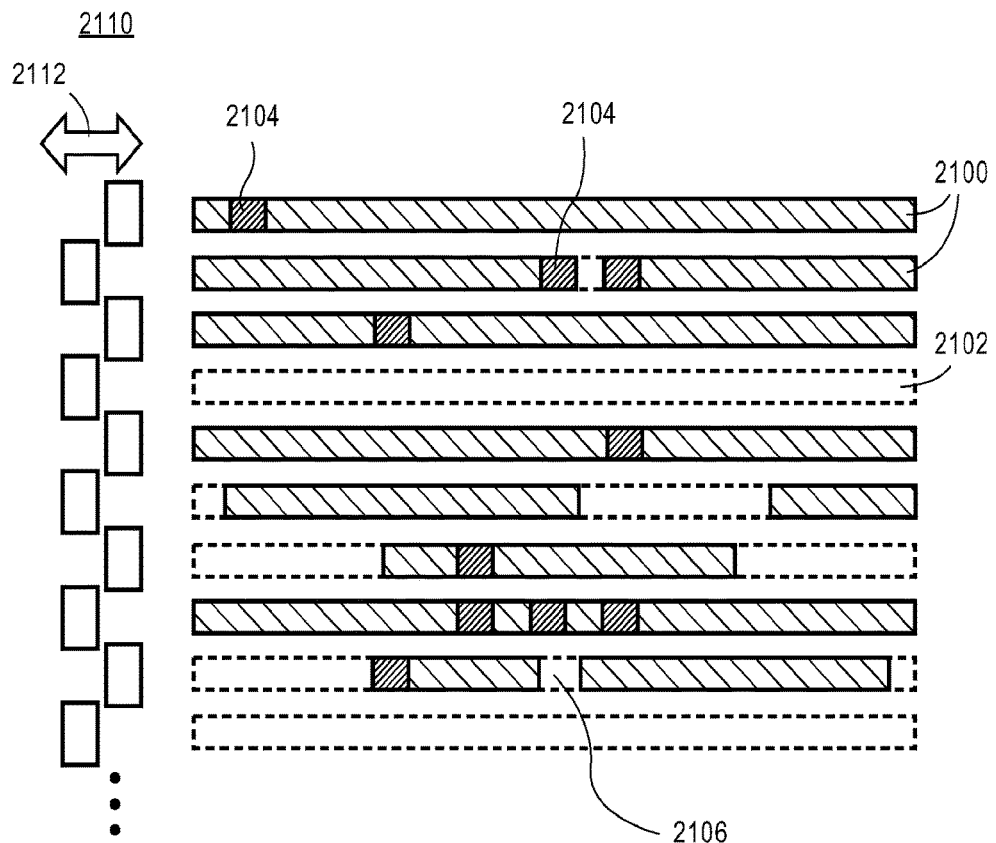
FIG. 21A illustrates two columns of staggered apertures (left) of a BAA relative to a plurality of lines (right) having cuts (breaks in the horizontal lines) or vias (filled-in boxes) patterned using the staggered BAA, with scanning direction shown by the arrow, in accordance with an embodiment of the present invention.

In a particular embodiment, a staggered BAA has two rows of staggered BAA openings. Such an array permits tight pitch wires, where wire pitch can be 2× the wire width. Furthermore, all wires can be cut in a single pass (or vias can be made in a single pass), thereby enabling throughput on the ebeam machine. FIG. 21A illustrates two columns of staggered apertures (left) of a BAA relative to a plurality of lines (right) having cuts (breaks in the horizontal lines) or vias (filled-in boxes) patterned using the staggered BAA, with scanning direction shown by the arrow, in accordance with an embodiment of the present invention.

Referring to FIG. 21A, the line result from a single staggered array could be as depicted, where lines are of single pitch, with cuts and vias patterned. In particular, FIG. 21A depicts a plurality of lines 2100 or open line positions 2102 where no lines exist. Vias 2104 and cuts 2106 may be formed along lines 2100. The lines 2100 are shown relative to a BAA 2110 having a scanning direction 2112. Thus, FIG. 21A may be viewed as a typical pattern produced by a single staggered array. Dotted lines show where cuts occurred in the patterned lines (including total cut to remove a full line or line portion). The via locations 2104 are patterning vias that land on top of the wires 2100.

In an embodiment, all or some of the openings or apertures of the BAA 2110 can be switched open or "closed" (e.g., beam deflecting) as the wafer/die moves underneath along the wafer travel direction 2112. In an embodiment, the BAA can be independently controlled as to whether each opening passes the ebeam through to the sample or deflects the beam into, e.g., a Faraday cup or blanking aperture. The apparatus may be built to deflect the overall beam coverage to just a portion of the BAA, and then individual openings in the BAA are electrically configured to pass the ebeam ("on") or not pass ("off"). It is to be appreciated that reference to "openings" or "opening heights" refers to the spot size impinged on the receiving wafer and not to the physical opening in the BAA since the physical openings are substantially larger (e.g., micron scale) than the spot size (e.g., nanometer scale) ultimately generated from the BAA. Thus, when described herein as the pitch of a BAA or column of openings in a BAA being said to "correspond" to the pitch of metal lines, such description actually refers to the relationship between pitch of the impinging spots as generated from the BAA and the pitch of the lines being cut. As an example, the spots generated from the BAA 2110 have a pitch the same as the pitch of the lines 2100 (when both columns of BAA openings are considered together). Meanwhile, the spots generated from only one column of the staggered array of the BAA 2110 have twice the pitch as the pitch of the lines 2100.

Figure 24A:
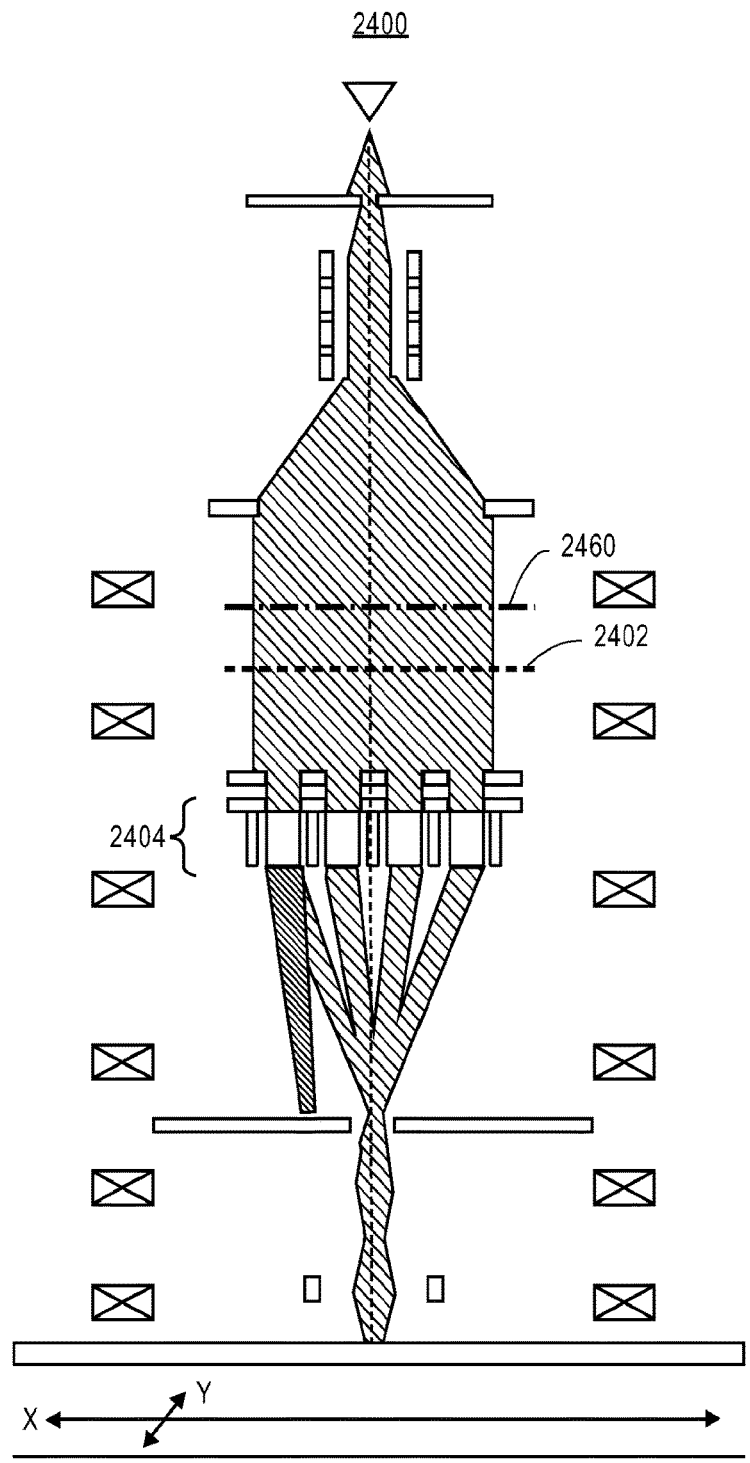
FIG. 24A includes a cross-sectional schematic representation of an ebeam column of an electron beam lithography apparatus having a deflector to shift the beam, in accordance with an embodiment of the present invention.
Figure 24B:
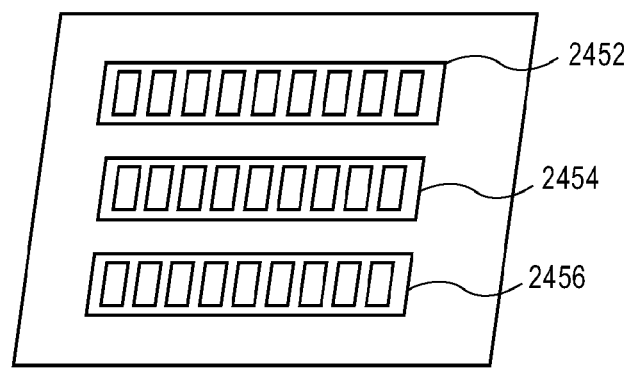
FIG. 24B illustrates a three (or up to n) pitch array for a BAA 2450 having pitch #1, cut #1, a pitch #2, cut #2 and a pitch #N, cut #N, in accordance with an embodiment of the present invention.
Figure 24C:
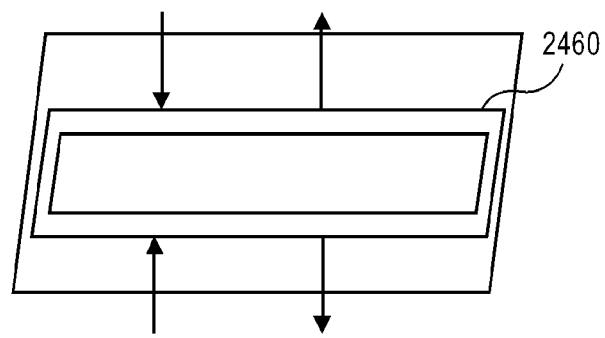
FIG. 24C illustrates a zoom in slit for inclusion on an ebeam column, in accordance with an embodiment of the present invention.

It is also to be appreciated that an ebeam column that includes a staggered beam aperture array (staggered BAA) as described above may also include other features in addition to those described in association with FIG. 4, some examples of which are further described in greater detail below in association with FIGS. 24A-24C. For example, in an embodiment, the sample stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage.

Figure 21B:
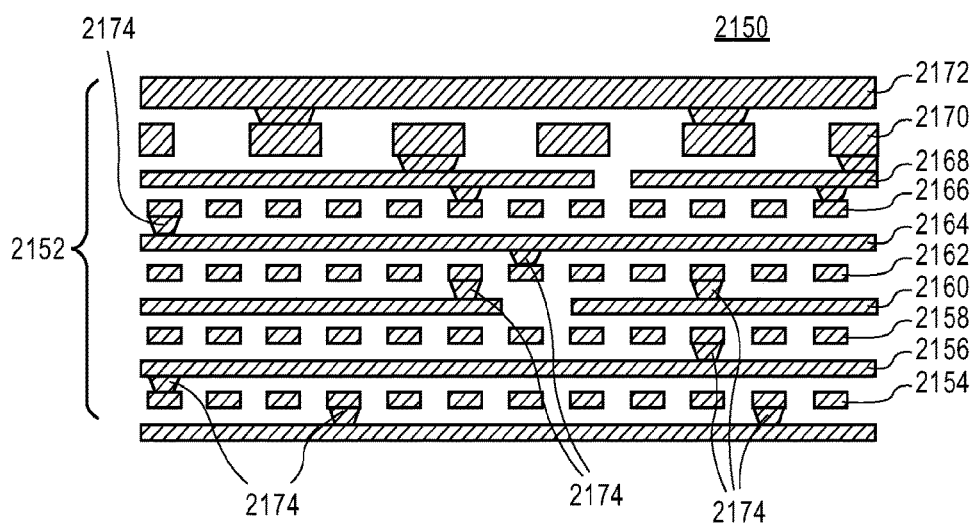
FIG. 21B illustrates a cross-sectional view of a stack of metallization layers in an integrated circuit based on metal line layouts of the type illustrated in FIG. 21A, in accordance with an embodiment of the present invention.

FIG. 21B illustrates a cross-sectional view of a stack 2150 of metallization layers 2152 in an integrated circuit based on metal line layouts of the type illustrated in FIG. 21A, in accordance with an embodiment of the present invention. Referring to FIG. 21B, in an exemplary embodiment, a metal cross-section for an interconnect stack 2150 is derived from a single BAA array for the lower eight matched metal layers 2154, 2156, 2158, 2160, 2162, 2164, 2166 and 2168.

It is to be appreciated that upper thicker/wider metal lines 2170 and 2172 would not be made with the single BAA. Via locations 2174 are depicted as connecting the lower eight matched metal layers 2154, 2156, 2158, 2160, 2162, 2164, 2166 and 2168.

In a fifth aspect of embodiments of the present invention, a three beam aperture array for an ebeam tool is described.

In an embodiment, a beam aperture array is implemented to solve throughput of an ebeam machine while also enabling minimum wire pitch. As described above, with no stagger, the problem of edge placement error (EPE) means that a minimum pitch that is twice the wire width cannot be cut since there is no possibility of stacking vertically in single stack. Embodiments described below extend the staggered BAA concept to permit three separate pitches to be exposed on a wafer, either through three passes, or by illuminating/controlling all three beam aperture arrays simultaneously in a single pass. The latter approach may be preferable for achieving the best throughput.

In some implementations, a three staggered beam aperture array is used instead of a single beam aperture array. The pitches of the three different arrays may either be related (e.g., 10-20-30) or unrelated pitches. The three pitches can be used in three separate regions on the target die, or the three pitches may occur simultaneously in the same localized region.

To provide context, the use of two or more single arrays would require a separate ebeam apparatus, or a change out of the beam aperture array for each different hole size/wire pitch. The result would otherwise be a throughput limiter and/or a cost of ownership issue. Instead, embodiments described herein are directed to BAAs having more than one (e.g., three) staggered array. In one such embodiment (in the case of including three arrays on one BAA), three different arrays of pitches can be patterned on a wafer without loss of throughput. Furthermore, the beam pattern may be steered to cover one of the three arrays. An extension of this technique can be used to pattern any mixture of different pitches by turning on and off the blanker holes in all three arrays as needed.

Figure 22:
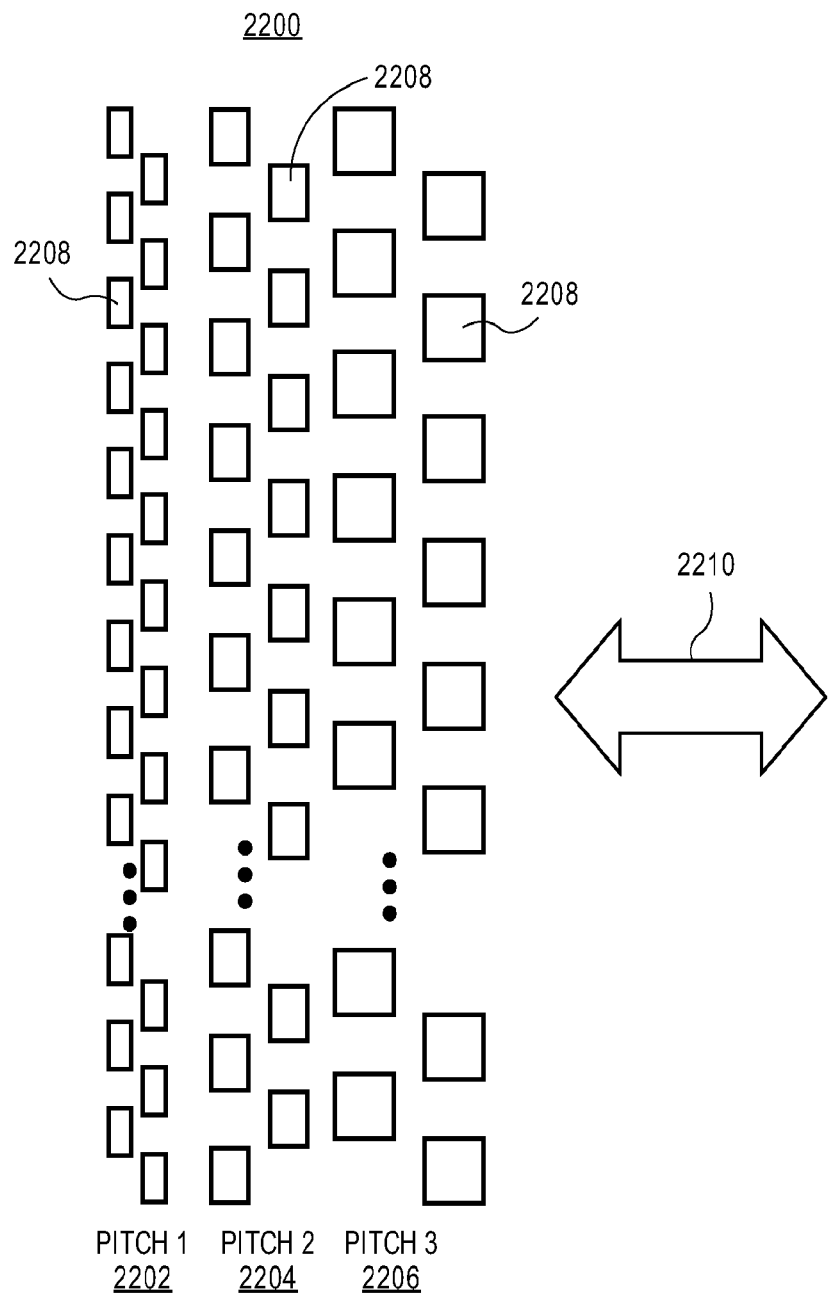
FIG. 22 illustrates apertures of a BAA having a layout of three different staggered arrays, in accordance with an embodiment of the present invention.

As an example, FIG. 22 illustrates apertures of a BAA 2200 having a layout of three different staggered arrays, in accordance with an embodiment of the present invention. Referring to FIG. 22, a three-column 2202, 2204 and 2206 blanker aperture array 2200 can be used for three different line pitches for cutting or making vias by all or some of the apertures 2208 which are switched open or "closed" (beam deflecting) as the wafer/die moves underneath along the wafer travel direction 2210. In one such embodiment, multiple pitches can be patterned without changing the BAA plate in the device. Furthermore, in a particular embodiment, multiple pitches can be printed at the same time. Both techniques allow many spots to be printed during a continuous pass of the wafer under the BAA. It is to be appreciated that while the focus of the description is on three separate columns of different pitches, embodiments can be extended to include any number of pitches that can fit within the apparatus, e.g., 1, 2, 3, 4, 5, etc.

Figure 23:
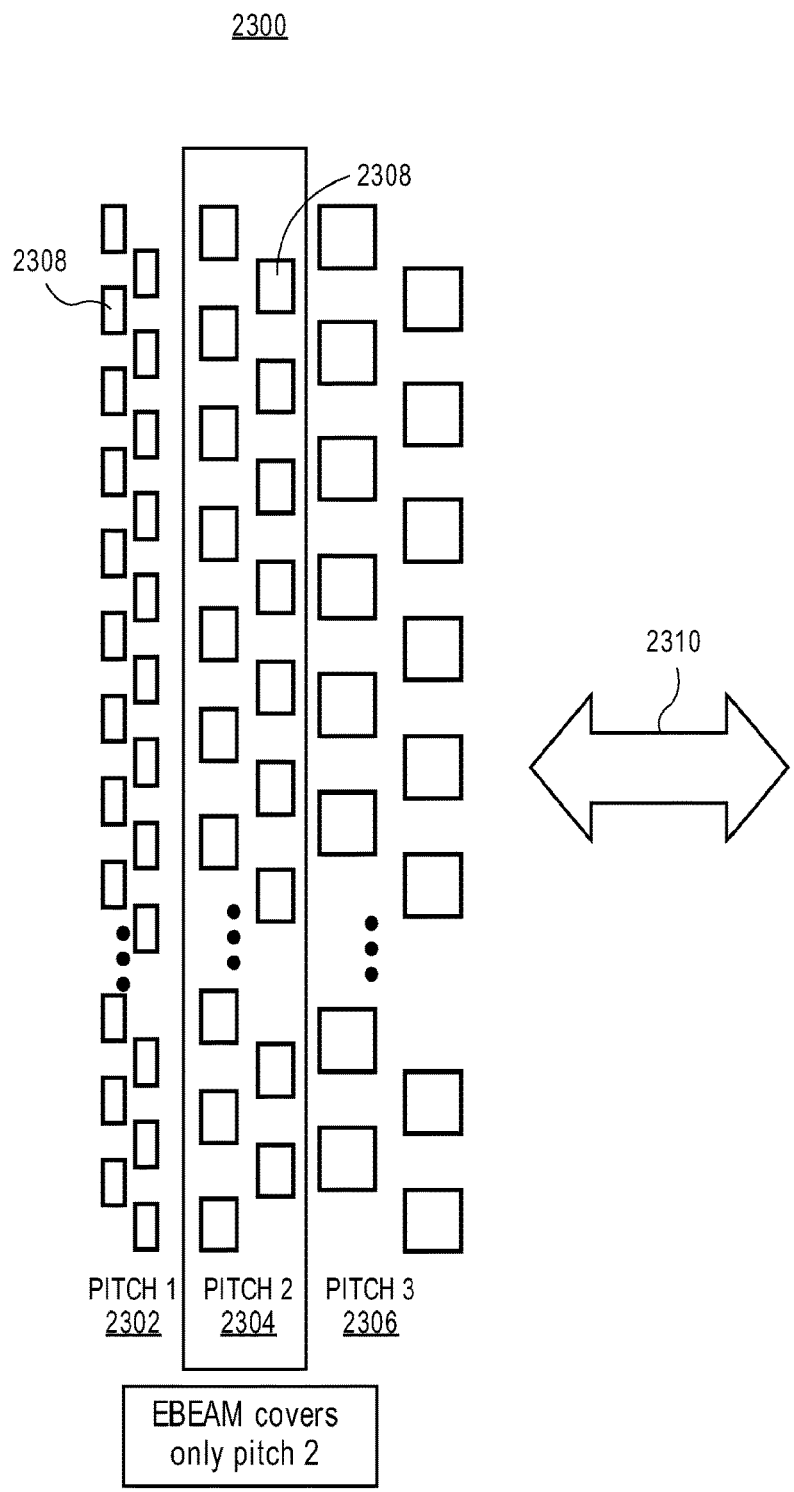
FIG. 23 illustrates apertures of a BAA having a layout of three different staggered arrays, where the ebeam covers only one of the arrays, in accordance with an embodiment of the present invention.

In an embodiment, the BAA can be independently controlled as to whether each opening passes the ebeam or deflects the beam into a Faraday cup or blanking aperture. The apparatus may be built to deflect the overall beam coverage to just a single pitch column, and then individual openings in the pitch column are electrically configured to pass the ebeam ("on") or not pass ("off"). As an example, FIG. 23 illustrates apertures 2308 of a BAA 2300 having a layout of three different staggered arrays 2302, 2304 and 2306, where the ebeam covers only one of the arrays (e.g., array 2304), in accordance with an embodiment of the present invention. In such an apparatus configuration, throughput could be gained for specific areas on a die that contain only a single pitch. The direction of travel of the underlying wafer is indicated by arrow 2310.

In one embodiment, in order to switch between pitch arrays, a deflector can be added to the ebeam column to allow the ebeam to be steerable onto the BAA pitch array. As an example, FIG. 24A includes a cross-sectional schematic representation of an ebeam column of an electron beam lithography apparatus having a deflector to shift the beam, in accordance with an embodiment of the present invention. Referring to FIG. 24A, an ebeam column 2400, such as described in association with FIG. 4, includes a deflector 2402. The deflector can be used to shift the beam onto an appropriate pitch/cut row in a shaping aperture corresponding to an appropriate array of a BAA 2404 having multiple pitch arrays. As an example, FIG. 24B illustrates a three (or up to n) pitch array for a BAA 2450 having pitch #1, cut #1 (2452), a pitch #2, cut #2 (2454) and a pitch #N, cut #N (2456). It is to be appreciated that the height of cut #n is not equal to the height of cut #n+m.

Other features may also be included in the ebeam column 2400. For example, further referring to FIG. 24A, in an embodiment, the stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage. In yet another example, FIG. 24C illustrates a zoom in slit 2460 for inclusion on an ebeam column. The positioning of such a zoom in slit 2460 on column 2400 is shown in FIG. 24A. The zoom in slit 2460 may be included to keep efficiency for different cut heights. It is to be appreciated that one or more of the above described features may be included in a single ebeam column.

In another embodiment, the ebeam fully illuminates multiple or all columns of pitches on the BAA. In such a configuration, all of the illuminated BAA openings would be electrically controlled to be "open" to pass the ebeam to the die, or "off" to prevent the ebeam from reaching the die. The advantage of such an arrangement is that any combination of holes could be used to print line cuts or via locations without reducing throughput. While the arrangement described in association with FIGS. 23 and 24A-24C could also be used to produce a similar result, a separate pass across the wafer/die for each of the pitch arrays would be required (which would reduce throughput by a factor of 1/n, where n is the number of pitch arrays on the BAA that require printing).

Figure 25:
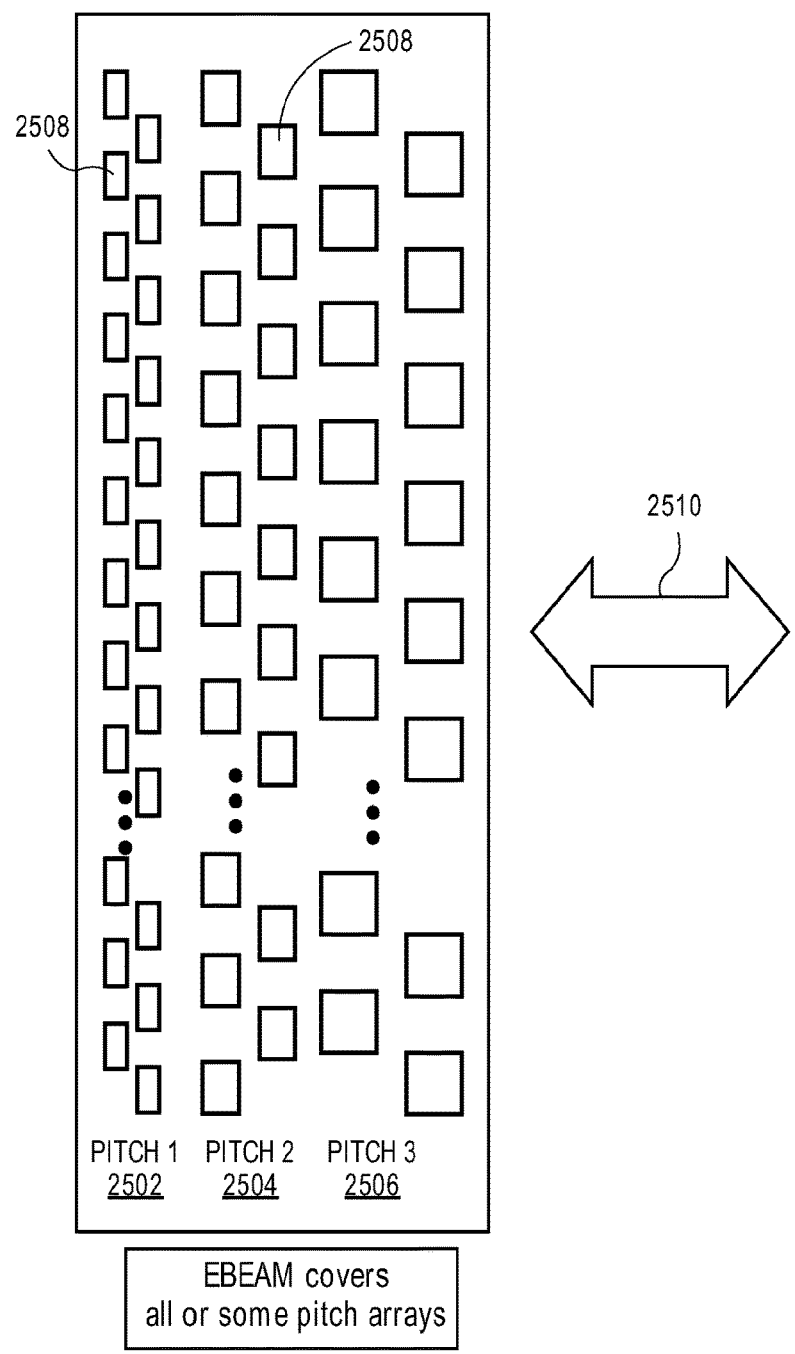
FIG. 25 illustrates apertures of a BAA having a layout of three different pitch staggered arrays, where the ebeam covers all of the arrays, in accordance with an embodiment of the present invention.

FIG. 25 illustrates apertures of a BAA having a layout of three different pitch staggered arrays, where the ebeam covers all of the arrays, in accordance with an embodiment of the present invention. Referring to FIG. 25, apertures 2508 of a BAA 2500 having a layout of three different staggered arrays 2502, 2504 and 2506, where the ebeam can cover all of the arrays (e.g., covers arrays 2502, 2504 and 2506), in accordance with an embodiment of the present invention. The direction of travel of the underlying wafer is indicated by arrow 2510.

In either the case of FIG. 23 or FIG. 25, having three pitches of openings permits the cutting or via creation for three different line or wire widths. However, the lines must be in alignment with the apertures of the corresponding pitch array (by contrast, a universal cutter is disclosed below).

Figure 26:
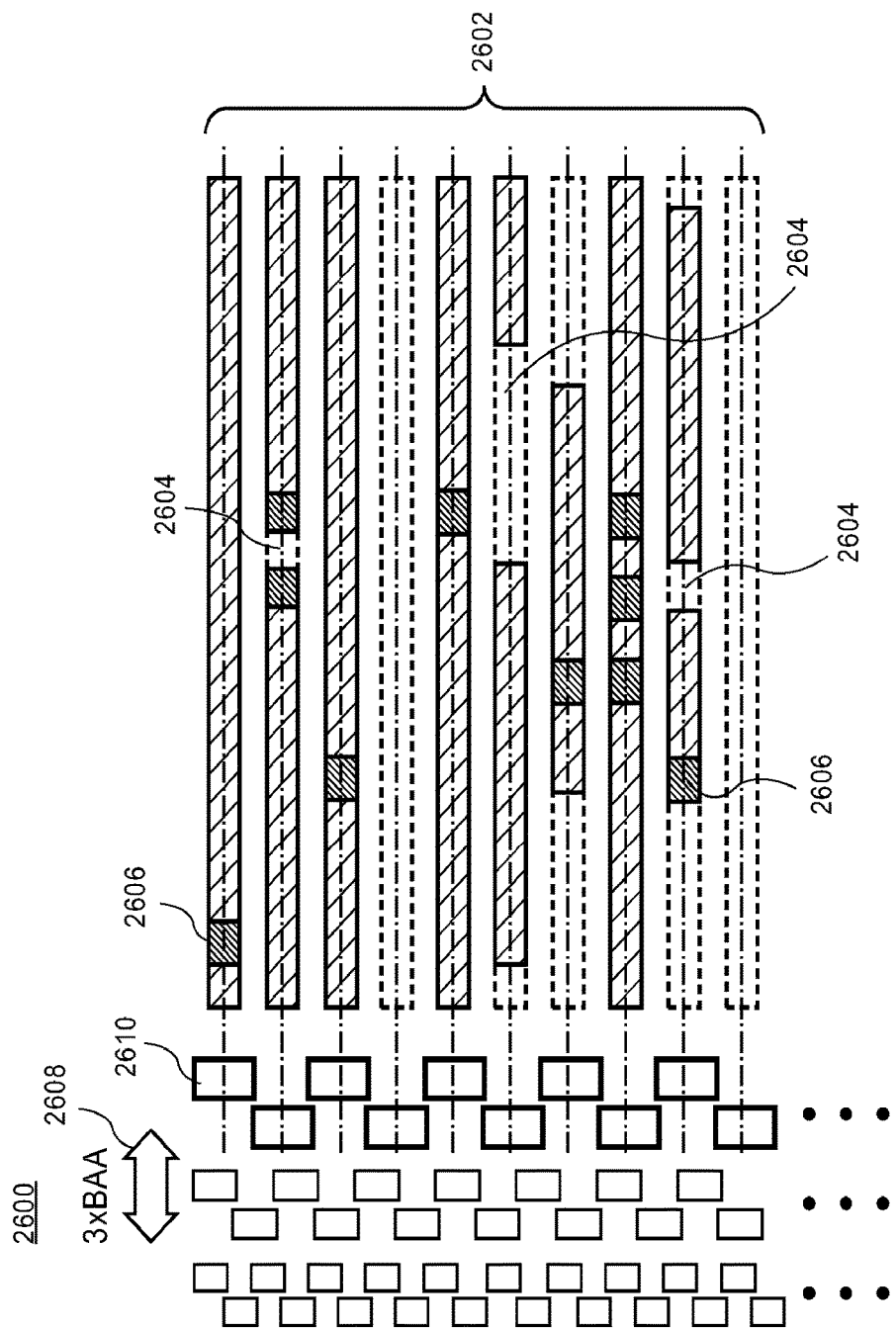
FIG. 26 illustrates a three beam staggered aperture array (left) of a BAA relative to a plurality of large lines (right) having cuts (breaks in the horizontal lines) or vias (filled-in boxes) patterned using the BAA, with scanning direction shown by the arrow, in accordance with an embodiment of the present invention.

FIG. 26 illustrates a three beam staggered aperture array 2600 of a BAA relative to a plurality of large lines 2602 having cuts (e.g., breaks 2604 in the horizontal lines) or vias (filled-in boxes 2606) patterned using the BAA, with scanning direction shown by the arrow 2608, in accordance with an embodiment of the present invention. Referring to FIG. 26, all the lines in a local region are of the same size (in this case, corresponding to the largest apertures 2610 on the right side of the BAA). Thus, FIG. 26 illustrates a typical pattern produced by one of three staggered beam aperture arrays. Dotted lines show where cuts occurred in patterned lines. Dark rectangles are patterning vias that land on top of the lines/wires 2602. In this case, only the largest blanker array is enabled.

Figure 27:
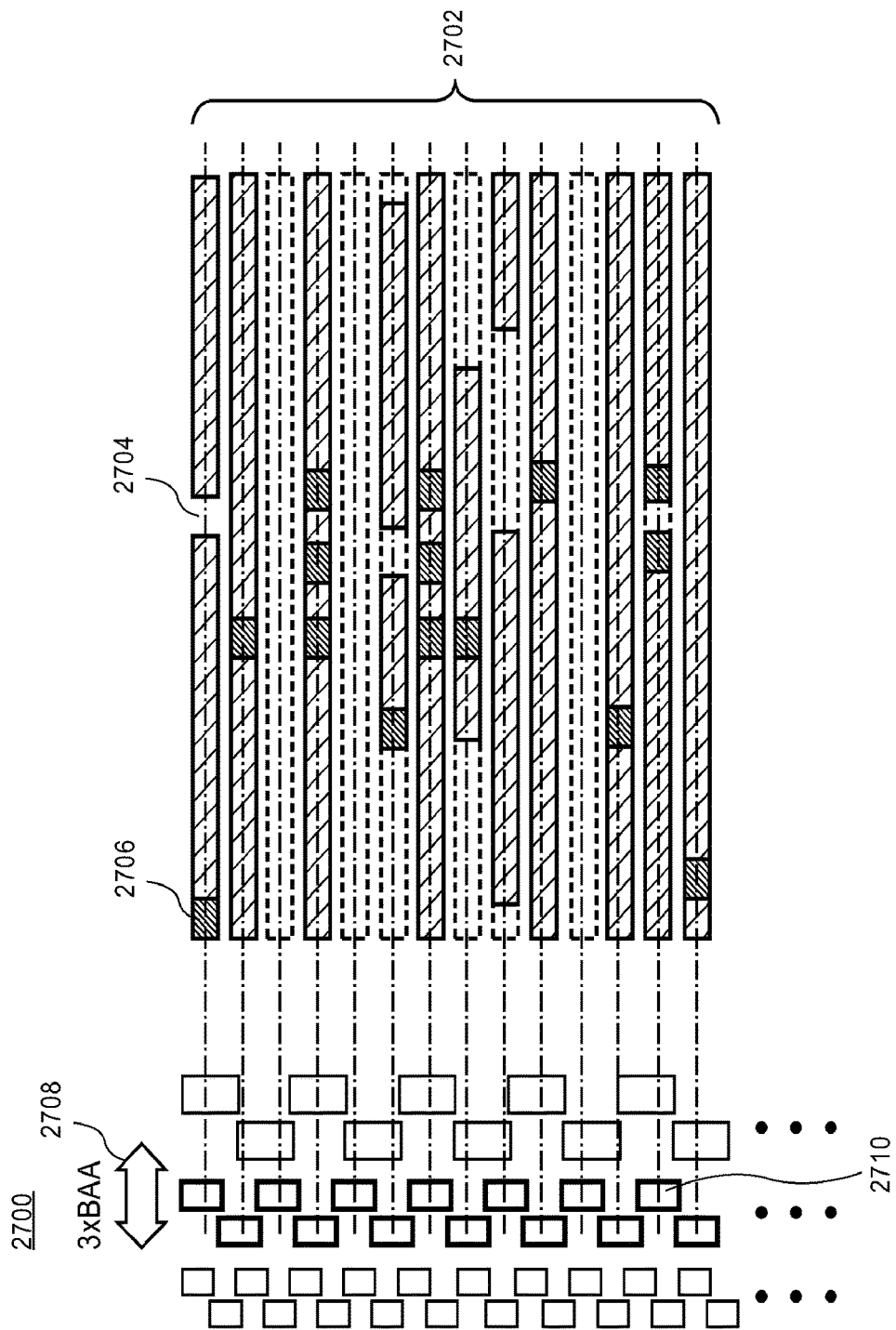
FIG. 27 illustrates a three beam staggered aperture array (left) of a BAA relative to a plurality of medium sized lines (right) having cuts (breaks in the horizontal lines) or vias (filled-in boxes) patterned using the BAA, with scanning direction shown by the arrow, in accordance with an embodiment of the present invention.

FIG. 27 illustrates a three beam staggered aperture array 2700 of a BAA relative to a plurality of medium sized lines 2702 having cuts (e.g., breaks 2704 in the horizontal lines) or vias (filled-in boxes 2706) patterned using the BAA, with scanning direction shown by the arrow 2708, in accordance with an embodiment of the present invention. Referring to FIG. 27, all the lines in a local region are of the same size (in this case, corresponding to the medium sized apertures 2710 in the middle of the BAA). Thus, FIG. 27 illustrates a typical pattern produced by one of three staggered beam aperture arrays. Dotted lines show where cuts occurred in patterned lines. Dark rectangles are patterning vias that land on top of the lines/wires 2702. In this case, only the medium blanker array is enabled.

Figure 28:
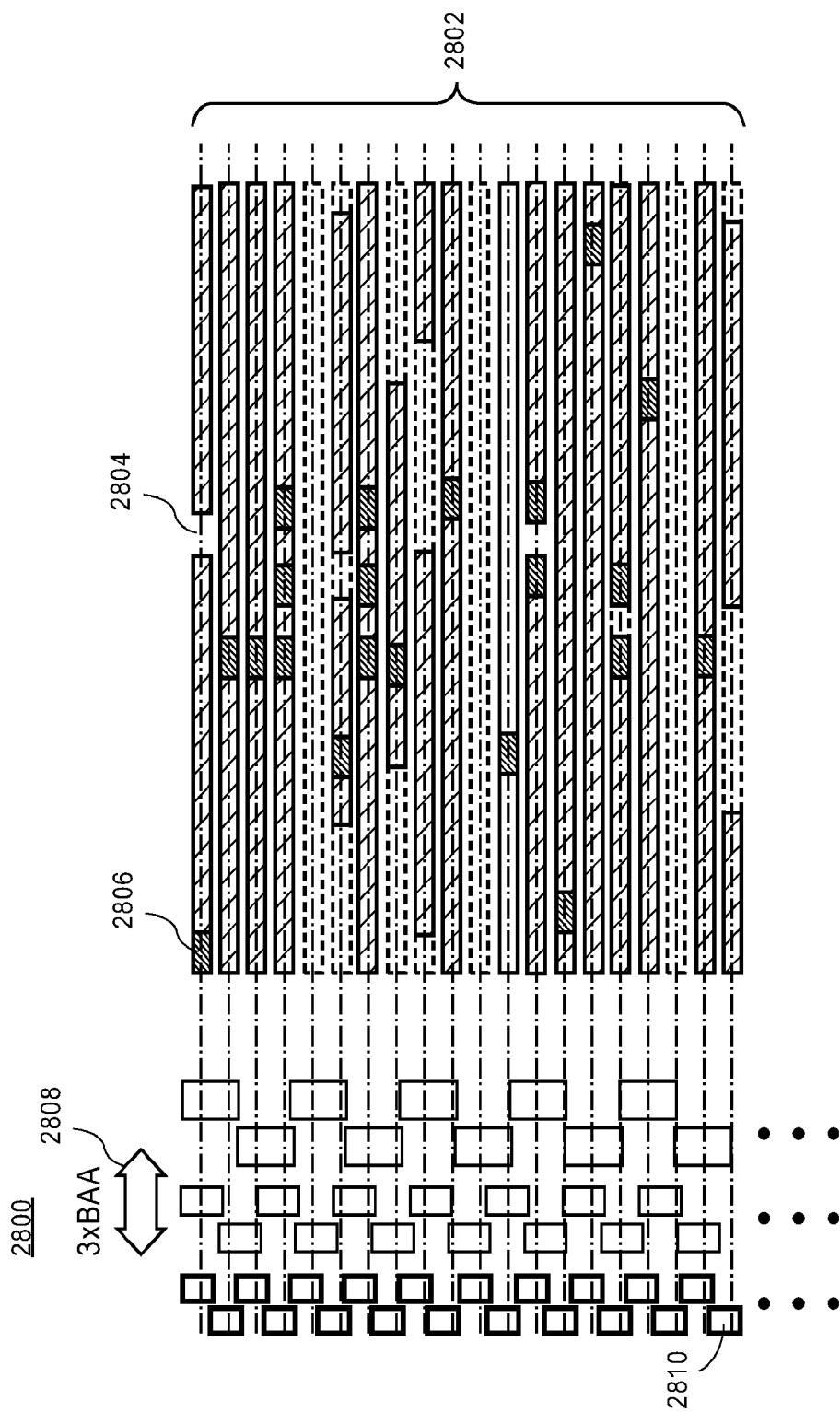
FIG. 28 illustrates a three beam staggered aperture array (left) of a BAA relative to a plurality of small lines (right) having cuts (breaks in the horizontal lines) or vias (filled-in boxes) patterned using the BAA, with scanning direction shown by the arrow, in accordance with an embodiment of the present invention.

FIG. 28 illustrates a three beam staggered aperture array 2800 of a BAA relative to a plurality of small lines 2802 having cuts (e.g., breaks 2804 in the horizontal lines) or vias (filled-in boxes 2806) patterned using the BAA, with scanning direction shown by the arrow 2808, in accordance with an embodiment of the present invention. Referring to FIG. 28, all the lines in a local region are of the same size (in this case, corresponding to the smallest apertures 2810 on the left side of the BAA). Thus, FIG. 28 illustrates a typical pattern produced by one of three staggered beam aperture arrays. Dotted lines show where cuts occurred in patterned lines. Dark rectangles are patterning vias that land on top of the lines/wires 2802. In this case, only the small blanker array is enabled.

Figure 29A:
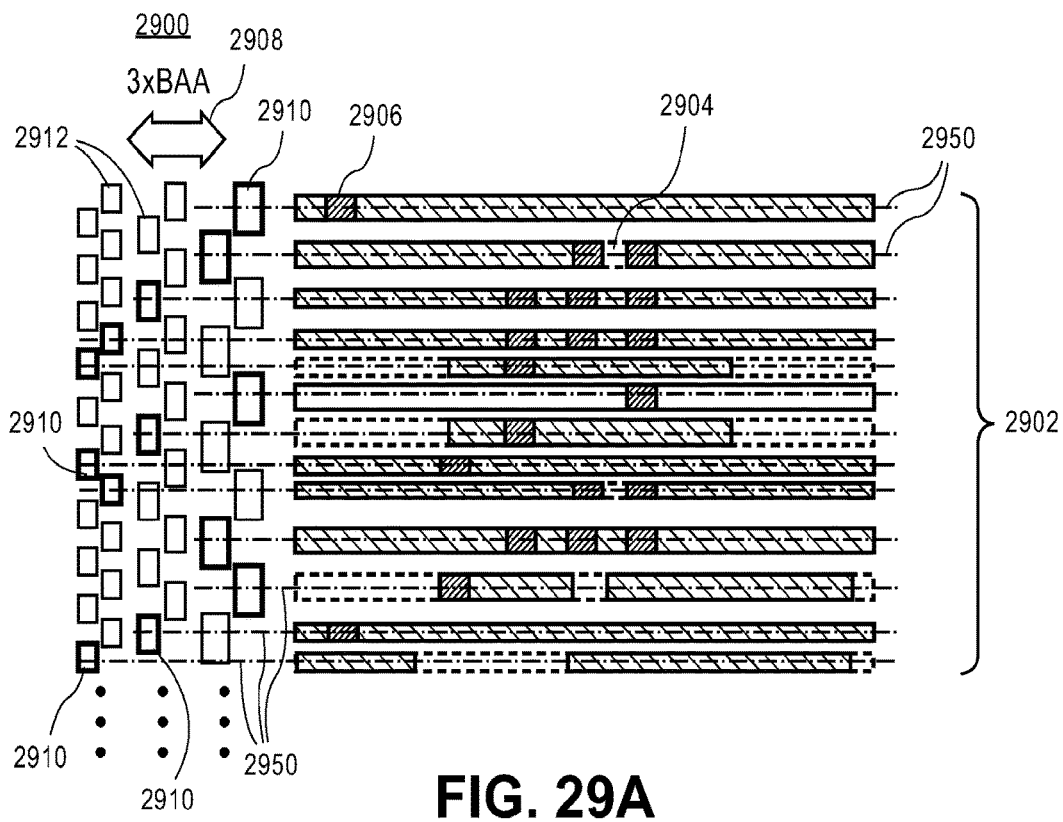
FIG. 29A illustrates a three beam staggered aperture array (left) of a BAA relative to a plurality of lines of varying size (right) having cuts (breaks in the horizontal lines) or vias (filled-in boxes) patterned using the BAA, with scanning direction shown by the arrow, in accordance with an embodiment of the present invention.

In another embodiment, combinations of the three pitches can be patterned, where the aperture alignment is possible against the lines already in these positions. FIG. 29A illustrates a three beam staggered aperture array 2900 of a BAA relative to a plurality of lines 2902 of varying size having cuts (e.g., breaks 2904 in the horizontal lines) or vias (filled-in boxes 2906) patterned using the BAA, with scanning direction shown by the arrow 2908, in accordance with an embodiment of the present invention. Referring to FIG. 29A, as many as three different metal widths can be patterned on the fixed grids 2950 that occur on the three-staggered BAA. The dark colored apertures 2910 of the BAA are being turned on/off during they scan. The light colored BAA apertures 2912 remain off. Thus, FIG. 29A illustrates a typical pattern produced by simultaneous use of all three staggered beam aperture arrays. Dotted lines show where cuts occurred in patterned lines. Dark rectangles are patterning vias that land on top of the lines/wires 2902. In this case, the small blanker array, the medium blanker array and the large blanker array are all enabled.

Figure 29B:
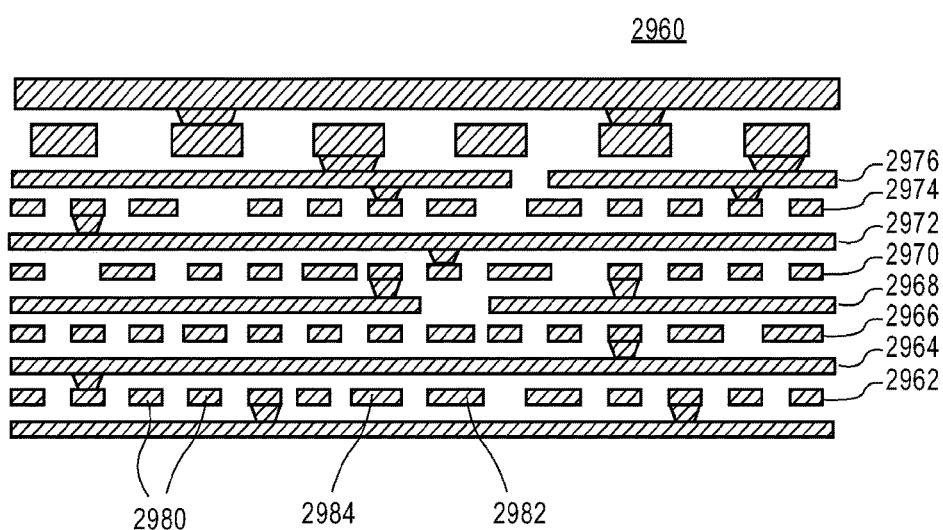
FIG. 29B illustrates a cross-sectional view of a stack of metallization layers in an integrated circuit based on metal line layouts of the type illustrated in FIG. 29A, in accordance with an embodiment of the present invention.

FIG. 29B illustrates a cross-sectional view of a stack 2960 of metallization layers in an integrated circuit based on metal line layouts of the type illustrated in FIG. 29A, in accordance with an embodiment of the present invention. Referring to FIG. 29B, in an exemplary embodiment, a metal cross-section for an interconnect stack is derived from three BAA pitch arrays of 1×, 1.5× and 3× pitch/width for the lower eight matched levels 2962, 2964, 2966, 2968, 2970, 2972, 2974 and 2976. For example, in level 2962, exemplary lines 2980 of 1×, an exemplary line 2982 of 1.5×, and an exemplary line 2984 of 3× are called out. It is to be appreciated that the varying width for the metals can only be seen for those layers with lines coming out of the page. All metals in the same layer are the same thickness regardless of metal width. It is to be appreciated that upper thicker/wider metals would not be made with the same three pitch BAA.

Figure 30:
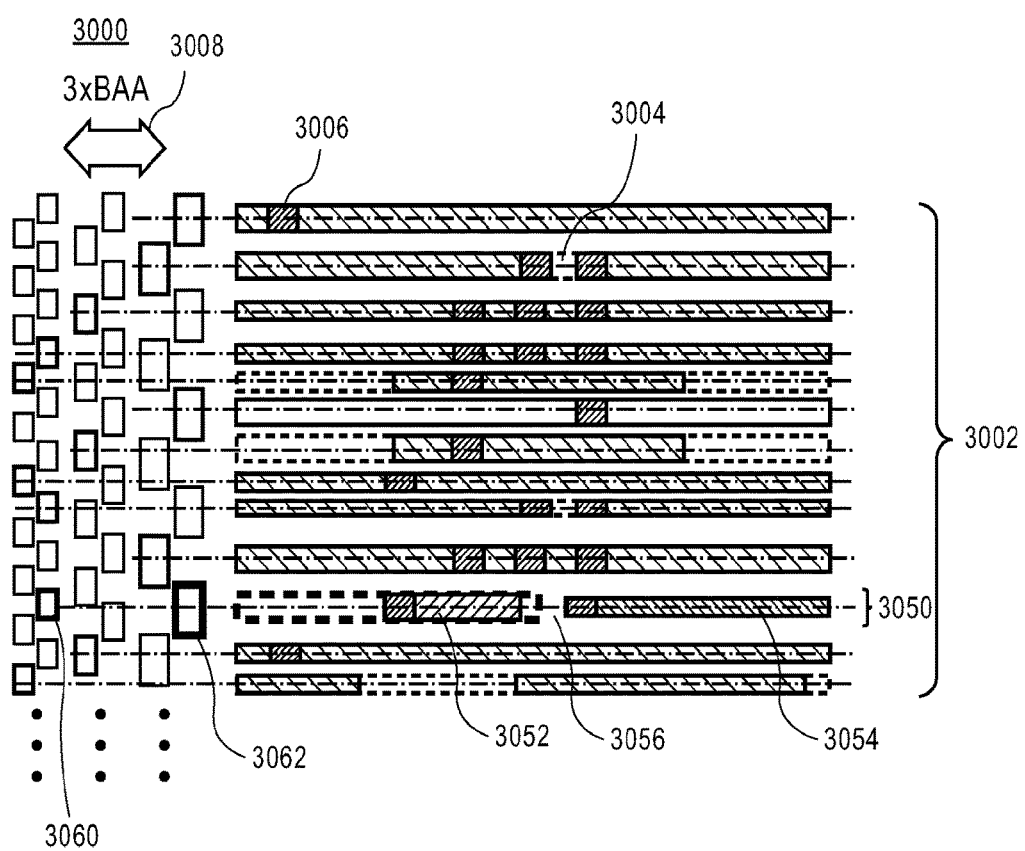
FIG. 30 illustrates a three beam staggered aperture array (left) of a BAA relative to a plurality of lines of varying size (right) having cuts (breaks in the horizontal lines) or vias (filled-in boxes) patterned using the BAA, with scanning direction shown by the arrow, in accordance with an embodiment of the present invention.

In another embodiment, different lines within the array can change width. FIG. 30 illustrates a three beam staggered aperture array 3000 of a BAA relative to a plurality of lines 3002 of varying size having cuts (e.g., breaks 3004 in the horizontal lines) or vias (filled-in boxes 3006) patterned using the BAA, with scanning direction shown by the arrow 3008, in accordance with an embodiment of the present invention. Referring to FIG. 30, the third horizontal line 3050 from the bottom of the array of lines 3002 has a wide line 3052 on a same grid line 3056 as a narrow line 3054. The corresponding different sized, but horizontally aligned, apertures 3060 and 3062 used to cut or make vias in the different sized lines are highlighted and horizontally centered with the two lines 3052 and 3054. Thus, FIG. 30 illustrates a scenario with the additional possibility to change line widths during patterning, as well as within different regions.

In a sixth aspect of embodiments of the present invention, a non-universal cutter for an ebeam tool is described.

In an embodiment, the cutting of multiple pitches of wires in the same region is made possible. In a particular implementation, high throughput ebeam processing is used to define cuts with two BAA arrays each with opening heights equal to predetermined values. As an illustrative example, N (20 nm-minimal layout pitch) and M (30 nm) can cut multiple pitch layouts (N[20], M[30], N*2[40], N*3 or M*2[60], N*4[80], M*3[90] nm) etc. with required EPE tolerance of minimum pitch/4 (N/4) provided that cut/plug tracks are placed on grids.

Figure 31:
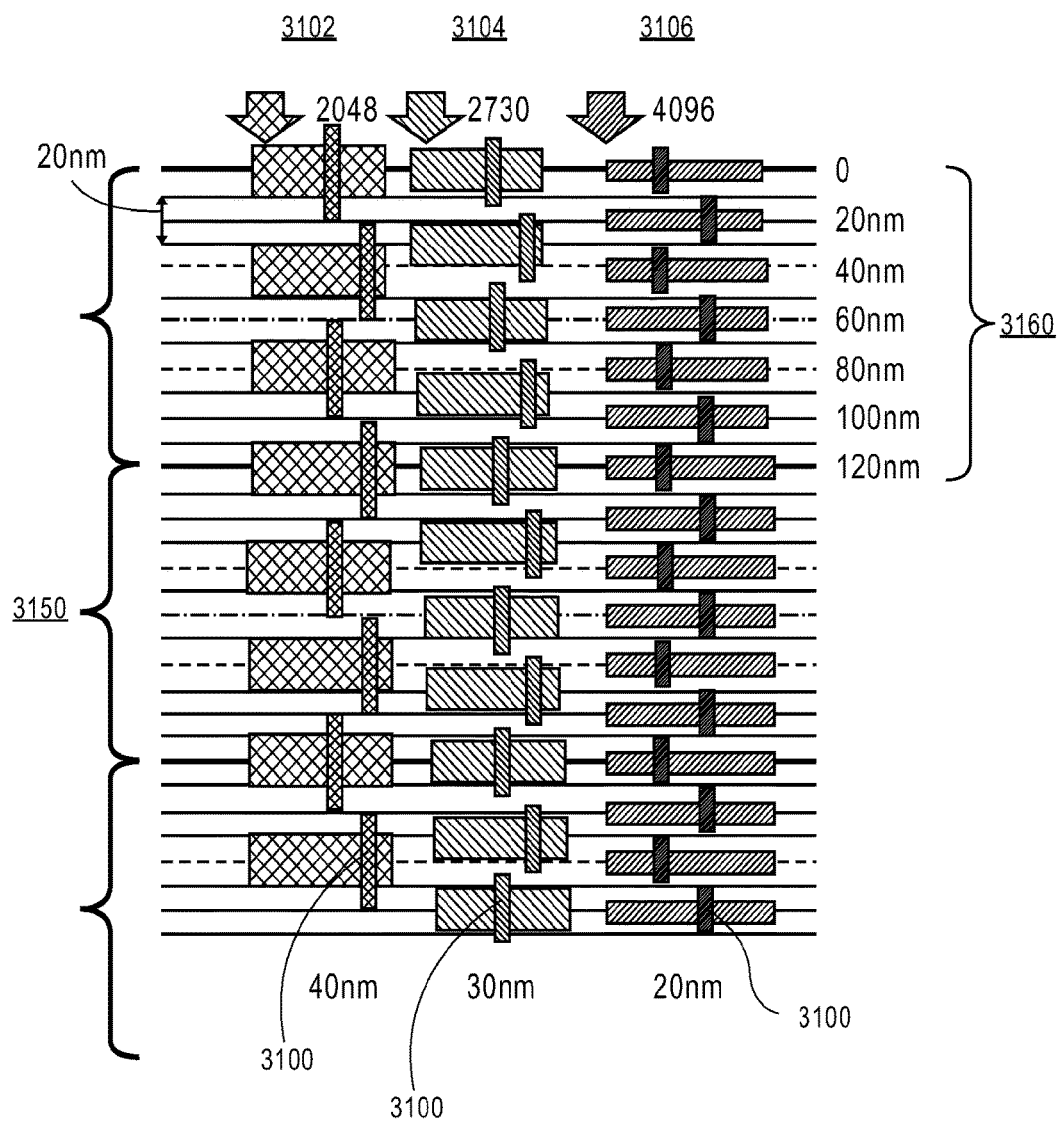
FIG. 31 illustrates three sets of lines of differing pitch with overlying corresponding apertures on each line, in accordance with an embodiment of the present invention.

FIG. 31 illustrates three sets of lines 3102, 3104 and 3106 of differing pitch with overlying corresponding apertures 3100 on each line, in accordance with an embodiment of the present invention. Referring to FIG. 31, a 40 nm, 30 nm and 20 nm arrays vertical pitch is shown. For the 40 nm pitch lines 3102, a staggered BAA (e.g., having 2048 openings) is available for cutting the lines. For the 30 nm pitch lines 3104, a staggered BAA (e.g., having 2730 openings) is available for cutting the lines. For the 20 nm pitch lines 3106, a staggered BAA (e.g., having 4096 openings) is available for cutting the lines. In this exemplary case, parallel lines drawn on a 10 nm step unidirectional grid 3150 with pitches 20 nm, 30 nm and 40 nm need to be cut. The BAA has three pitches (i.e., three sub-arrays) and is axially aligned with drawn tracks 3160, as depicted in FIG. 31.

Provided each aperture on each of the three sub-arrays of FIG. 31 has its own driver, cutting of complex layouts with tracks on a layout consistent with the depicted unidirectional grid can be performed with tool throughput independent of number and mix of pitches present in the layout. The result is that multiple cuts, multiple simultaneous cuts of different widths, and cuts of widths that are greater than any single pitch are made possible. The design may be referred to as pitch agnostic throughput. To provide context, such a result is not possible where multiple passes of the wafer are required for each pitch. It is to be appreciated that such an implementation is not restricted to three BAA opening sizes.

Additional combinations could be produced as long as there is a common grid relationship between the various BAA pitches.

Figure 32:
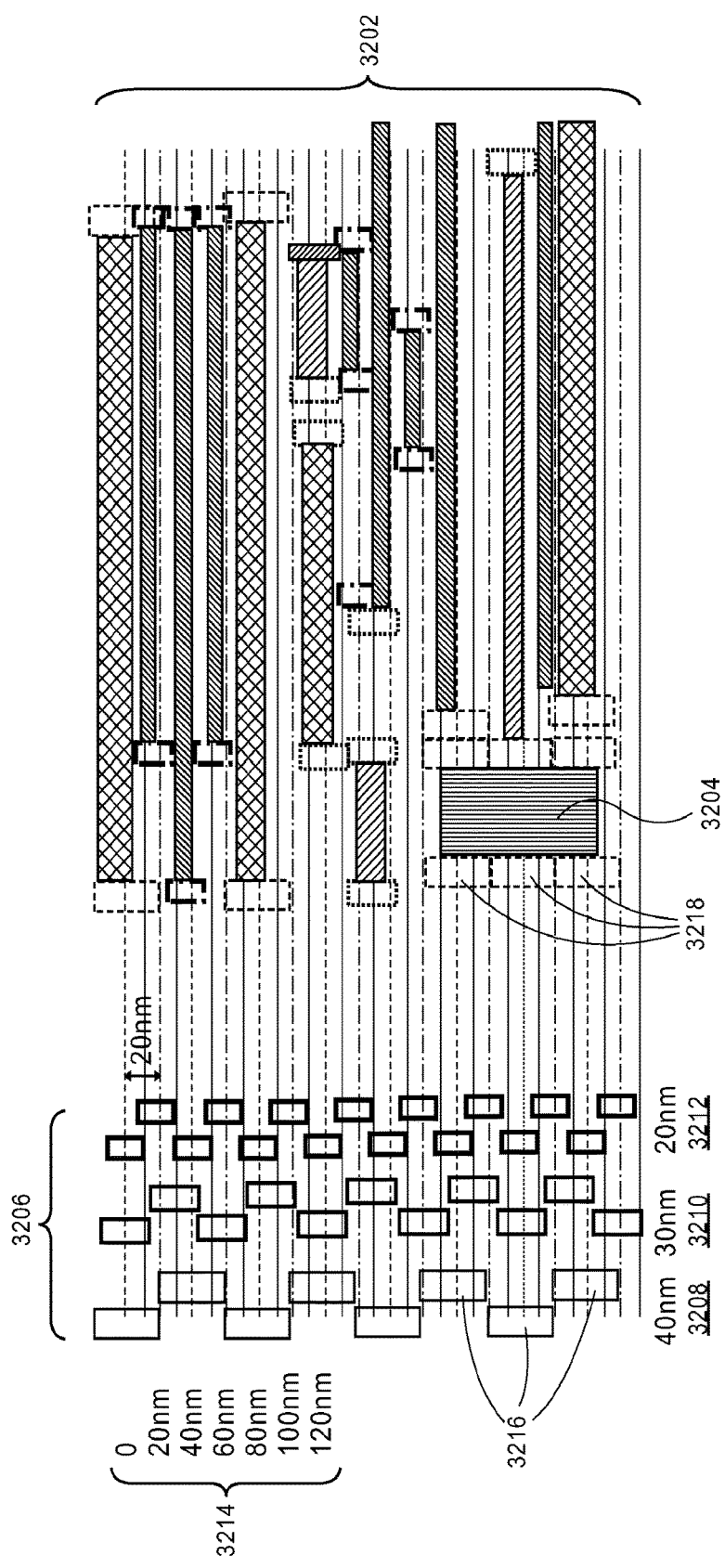
FIG. 32 illustrates a plurality of different sized lines (right) including one very large line, and a beam aperture arrays vertical pitch layout (three arrays) on a common grid, in accordance with an embodiment of the present invention.

Furthermore, in an embodiment, multiple cuts made at the same time are possible with multiple pitches, and wider lines are accommodated by combinations of different openings that completely cover the cut distance. For example, FIG. 32 illustrates a plurality of different sized lines 3202 including one very large line 3204, and a beam aperture arrays vertical pitch layout 3206 (three arrays 3208, 3210 and 3212) on a common grid 3214, in accordance with an embodiment of the present invention. The very wide line 3204 is cut by a combination of three large apertures 3216 which are additive in the vertical direction. It is to be appreciated in viewing FIG. 32, the wires 3202 are shown as being cut by various openings which are shown as dashed boxes (e.g., dashed boxes 3218 corresponding to apertures 3216).

In a seventh aspect of embodiments of the present invention, a universal cutter for an ebeam tool is described.

In an embodiment, high throughput ebeam processing is enabled by defining cuts such that a single (universal) BAA having opening heights equal to predetermined values can be used for a variety of line pitches/widths. In one such embodiment, the opening heights are targeted at half of the minimal pitch layout. It is to be appreciated that reference to "opening heights" refers to the spot size impinged on the receiving wafer and not to the physical opening in the BAA since the physical openings are substantially larger (e.g., micron scale) than the spot size (e.g., nanometer scale) ultimately generated from the BAA. In a particular example, the height of the openings is 10 nm for a minimal layout pitch of N=20 nm). In such a case, multiple pitch layouts (e.g., N[20], M[30], N*2[40], N*3 or M*2[60], N*4[80], M*3[90] nm) etc. can be cut. The cuts can be performed with a required EPE tolerance of minimum pitch/4 (N/4) provided cut/plug tracks are placed on a predetermined grid where tracks axes are aligned on a predetermined one-dimensional (1D) grid coincidental with the middle between two BAA openings. Each metal track adjacency is interrupted by exposing two openings at the minimum to satisfy an EPE requirement=pitch/4.

Figure 33:
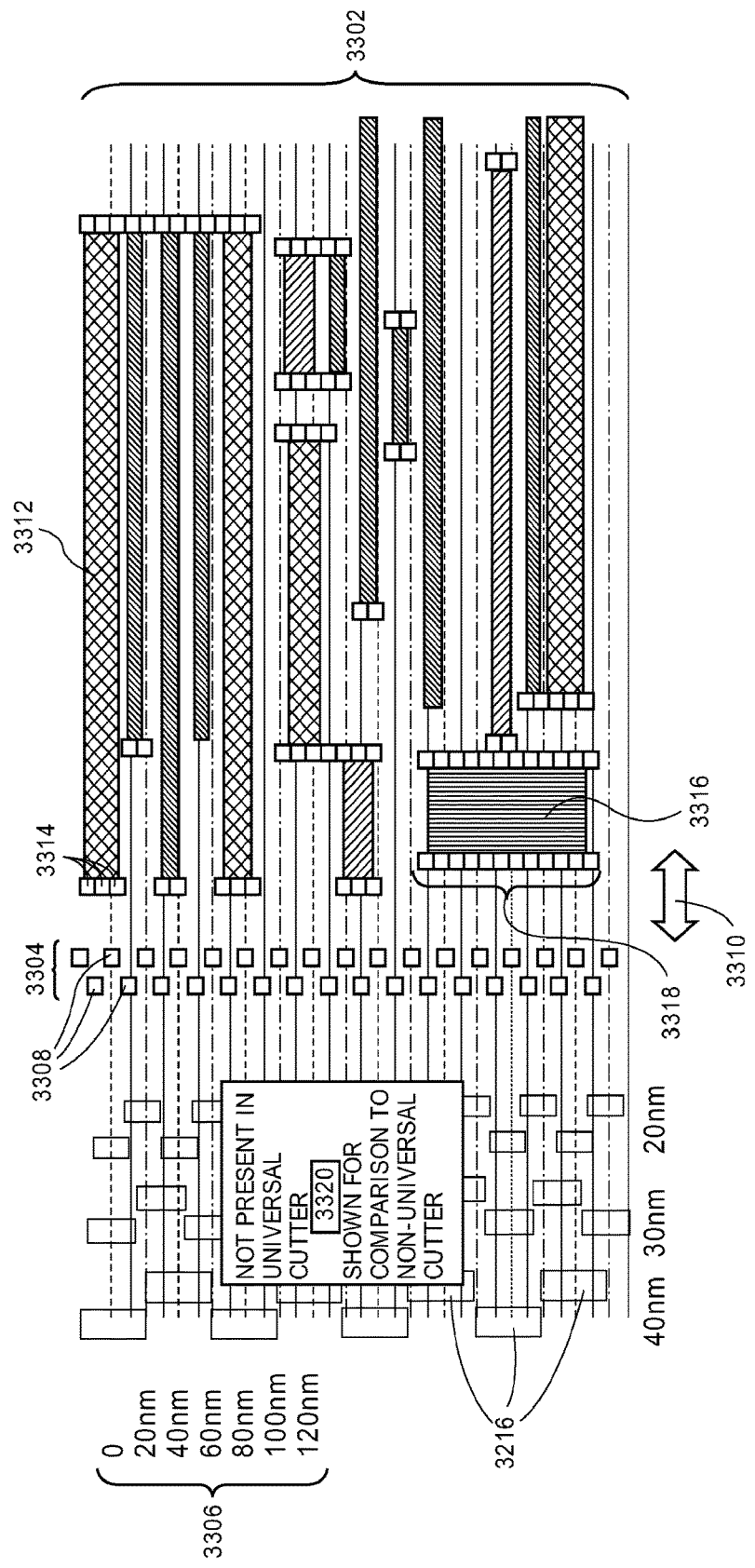
FIG. 33 illustrates a plurality of different sized lines (right), and a universal cutter pitch array (left), in accordance with an embodiment of the present invention.

In an example, FIG. 33 illustrates a plurality of different sized lines 3302, and a universal cutter pitch array 3304, in accordance with an embodiment of the present invention. Referring to FIG. 33, in a particular embodiment, a BAA having a 10 nm pitch array 3304 with, e.g., 8192 openings (only a few of which are shown) is used as a universal cutter. It is to be appreciated that although shown on a common grid 3306, in one embodiment, the lines need not actually be aligned to a grid at all. In that embodiment, spacing is differentiated by the cutter openings.

More generally, referring again to FIG. 33, a beam aperture array 3304 includes an array of staggered square beam openings 3308 (e.g., 8192 staggered square beam openings) that can be implemented to cut any width line/wire 3302 by using one or more of the openings in conjunction in the vertical direction while the scan is performed along the horizontal direction 3310. The only restriction is that adjacent wires be 2*EPE for cutting any individual wire. In one embodiment, the wires are cut by combinations of universal cutter openings 3308 chosen on the fly from the BAA 3304. As an example, line 3312 is cut by three openings 3314 from the BAA 3304. In another example, line 3316 is cut by 11 openings 3318 from the BAA 3304.

For comparison to a non-universal cutter, a grouping of arrays 3320 is illustrated in FIG. 33. It is to be appreciated that the grouping of arrays 3320 is not present in the universal cutter, but are shown for comparison of the universal cutter to a non-universal cutter based on the grouping of arrays 3320.

To provide context, other beam aperture array arrangements require openings that are specifically aligned on the centerline of the lines to be cut. Instead, in accordance with an embodiment herein, a universal aperture array technique allows universal cutting of any width line/wire on non-aligned line centerlines. Furthermore, changes in line widths (and spacings) that would otherwise be fixed by the BAA of other techniques are accommodated by the universal cutter. Accordingly, late changes to a fabrication process, or lines/wires specifically tailored to the RC needs of an individual circuit may be permitted.

Figure 34:
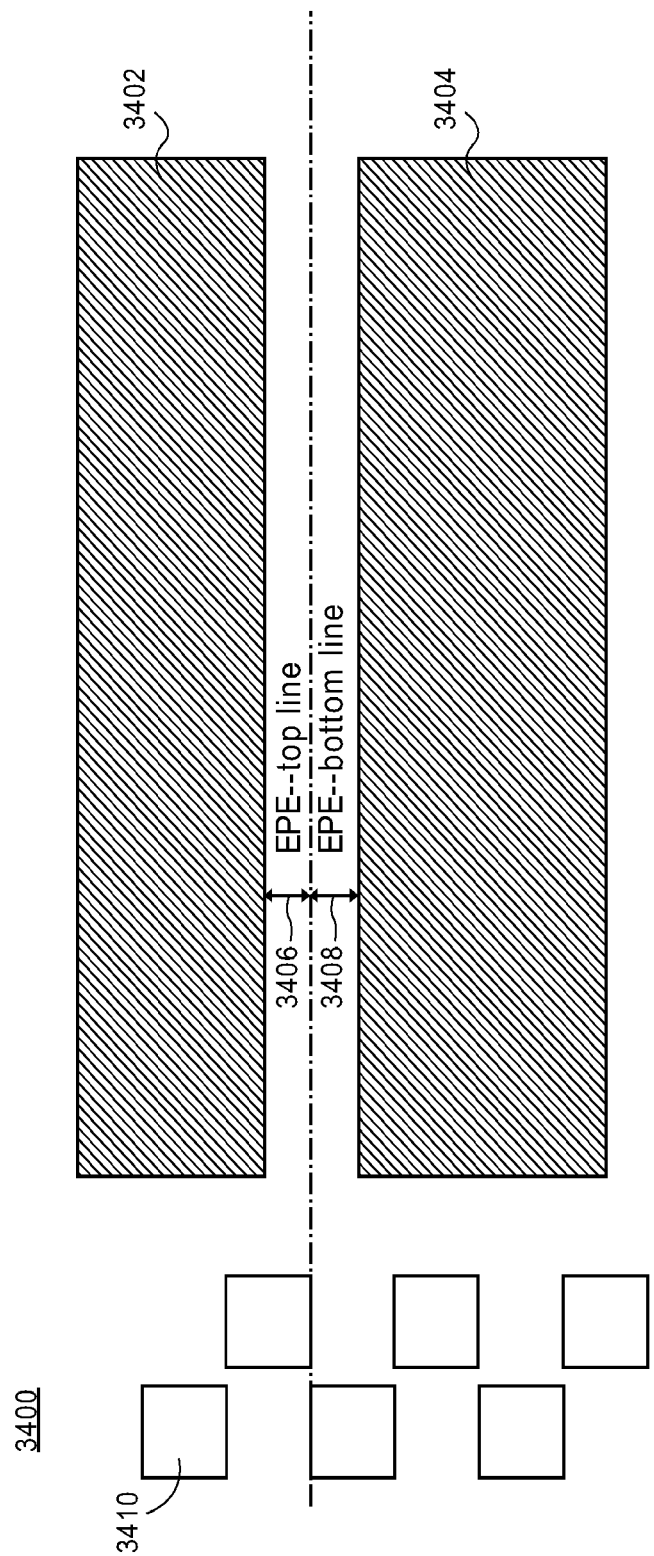
FIG. 34 demonstrates the 2*EPE rule for a universal cutter (left) as referenced against two lines (right), in accordance with an embodiment of the present invention.

It is to be appreciated that as long as the EPE coverage requirement of pitch/4 is met, the various lines/wires do not have to be exactly aligned in a universal cutter scenario. The only restrictions is that sufficient enough space is provided between lines to have EPE/2 distance between lines with the cutter lining up at EPE/4 as follows. FIG. 34 demonstrates the 2*EPE rule for a universal cutter 3400 as referenced against two lines 3402 and 3404, in accordance with an embodiment of the present invention. Referring to FIG. 34, the EPE 3406 of the top line and the EPE 3408 of the bottom line provide the 2*EPE width which corresponds to the pitch of the universal cutter holes 3410. Thus, the rule for opening pitch corresponds to the minimum space between two lines. If the distance is greater than this, the cutter will cut any arbitrary width line. Note that the minimum hole size and pitch is exactly equal to 2*EPE for lines.

In an embodiment, by using a universal cutter, the resulting structures can have random wire widths and placement in an ebeam-produced semiconductor sample. The random placement, however, is still described as unidirectional since no orthogonal lines or hooks are fabricated in this approach. A universal cutter can be implemented for cutting many different pitches and widths, e.g., whatever can be fabricated by patterning prior to ebeam patterning used for cuts and vias. As a comparison, the above described staggered array and three-staggered array BAAs are associated with fixed locations for the pitches.

Figure 35:
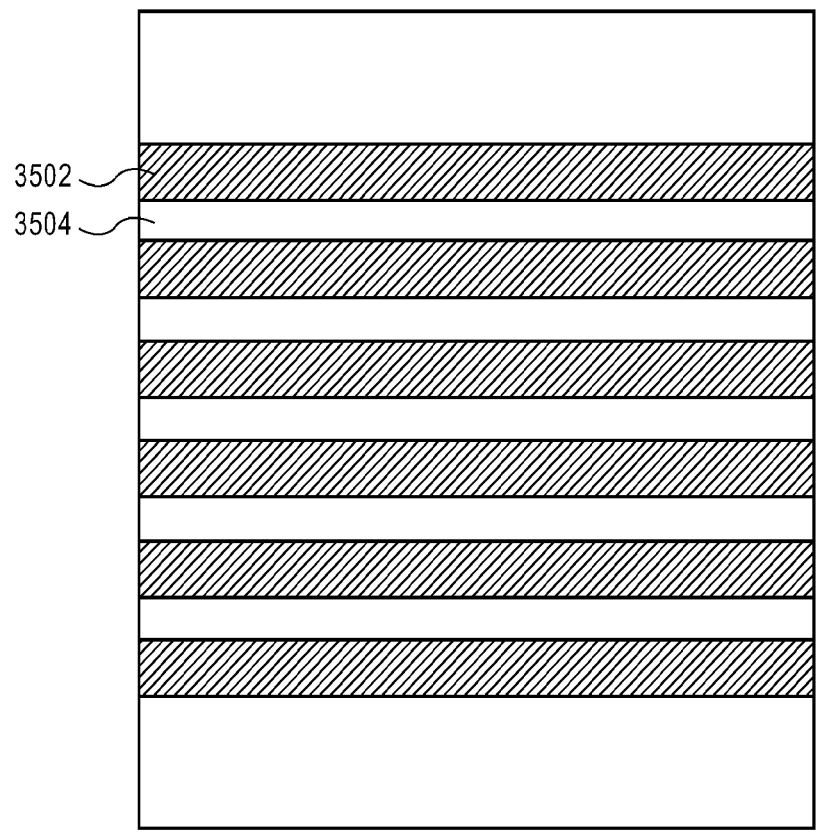
FIG. 35 illustrates a plan view and corresponding cross-sectional view of a previous layer metallization structure, in accordance with an embodiment of the present invention.
Figure 35:
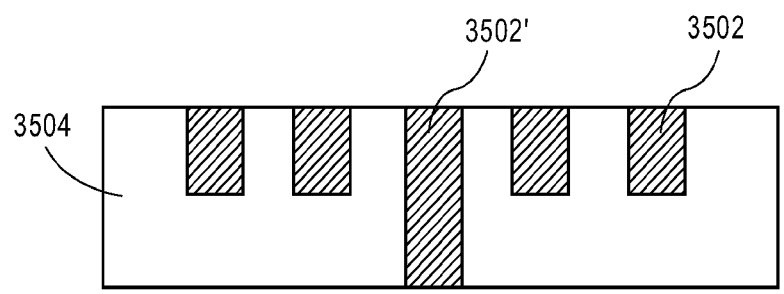

More generally, referring to all of the above aspects of embodiments of the present invention, it is to be appreciated that a metallization layer having lines with line cuts (or plugs) and having associated vias may be fabricated above a substrate and, in one embodiment, may be fabricated above a previous metallization layer. As an example, FIG. 35 illustrates a plan view and corresponding cross-sectional view of a previous layer metallization structure, in accordance with an embodiment of the present invention. Referring to FIG. 35, a starting structure 3500 includes a pattern of metal lines 3502 and interlayer dielectric (ILD) lines 3504. The starting structure 3500 may be patterned in a grating-like pattern with metal lines spaced at a constant pitch and having a constant width, as is depicted in FIG. 35. Although not shown, the lines 3502 may have interruptions (i.e., cuts or plugs) at various locations along the lines. The pattern, for example, may be fabricated by a pitch halving or pitch quartering approach, as described above. Some of the lines may be associated with underlying vias, such as line 3502' shown as an example in the cross-sectional view.

In an embodiment, fabrication of a metallization layer on the previous metallization structure of FIG. 35 begins with formation of an interlayer dielectric (ILD) material above the structure 3500. A hardmask material layer may then be formed on the ILD layer. The hardmask material layer may be patterned to form a grating of unidirectional lines orthogonal to the lines 3502 of 3500. In one embodiment, the grating of unidirectional hardmask lines is fabricated using conventional lithography (e.g., photoresist and other associated layers) and may have a line density defined by a pitch-halving, pitch-quartering etc. approach as described above. The grating of hardmask lines leaves exposed a grating region of the underlying ILD layer. It is these exposed portions of the ILD layer that are ultimately patterned for metal line formation, via formation, and plug formation. For example, in an embodiment, via locations are patterned in regions of the exposed ILD using EBL as described above. The patterning may involve formation of a resist layer and patterning of the resist layer by EBL to provide via opening locations which may be etched into the ILD regions. The lines of overlying hardmask can be used to confine the vias to only regions of the exposed ILD, with overlap accommodated by the hardmask lines which can effectively be used as an etch stop. Plug (or cut) locations may also be patterned in exposed regions of the ILD, as confined by the overlying hardmask lines, in a separate EBL processing operation. The fabrication of cuts or plugs effectively preserve regions of ILD that will ultimately interrupt metal lines fabricated therein. Metal lines may then be fabricated using a damascene approach, where exposed portions of the ILD (those portions between the hardmask lines and not protected by a plug preservation layer, such as a resist layer patterned during "cutting") are partially recessed. The recessing may further extend the via locations to open metal lines from the underlying metallization structure. The partially recessed ILD regions are then filled with metal (a process which may also involve filling the via locations), e.g., by plating and CMP processing, to provide metal lines between the overlying hardmask lines. The hardmask lines may ultimately be removed for completion of a metallization structure. It is to be appreciated that the above ordering of line cuts, via formation, and ultimate line formation is provided only as an example. A variety of processing schemes may be accommodated using EBL cuts and vias, as described herein.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, hardmask materials are composed of dielectric materials different from the interlayer dielectric material. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be appreciated that the layers and materials described in association with FIG. 35 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 35 may be fabricated on underlying lower level interconnect layers.

In another embodiment, EBL cuts may be used to fabricate semiconductor devices, such as PMOS or NMOS devices of an integrated circuit. In one such embodiment, EBL cuts are used to pattern a grating of active regions that are ultimately used to form fin-based or trigate structures. In another such embodiment, EBL cuts are used to pattern a gate layer, such as a poly layer, ultimately used for gate electrode fabrication. As an example of a completed device, FIGS. 36A and 36B illustrate a cross-sectional view and a plan view (taken along the a-a' axis of the cross-sectional view), respectively, of a non-planar semiconductor device having a plurality of fins, in accordance with an embodiment of the present invention.

Figure 36A:
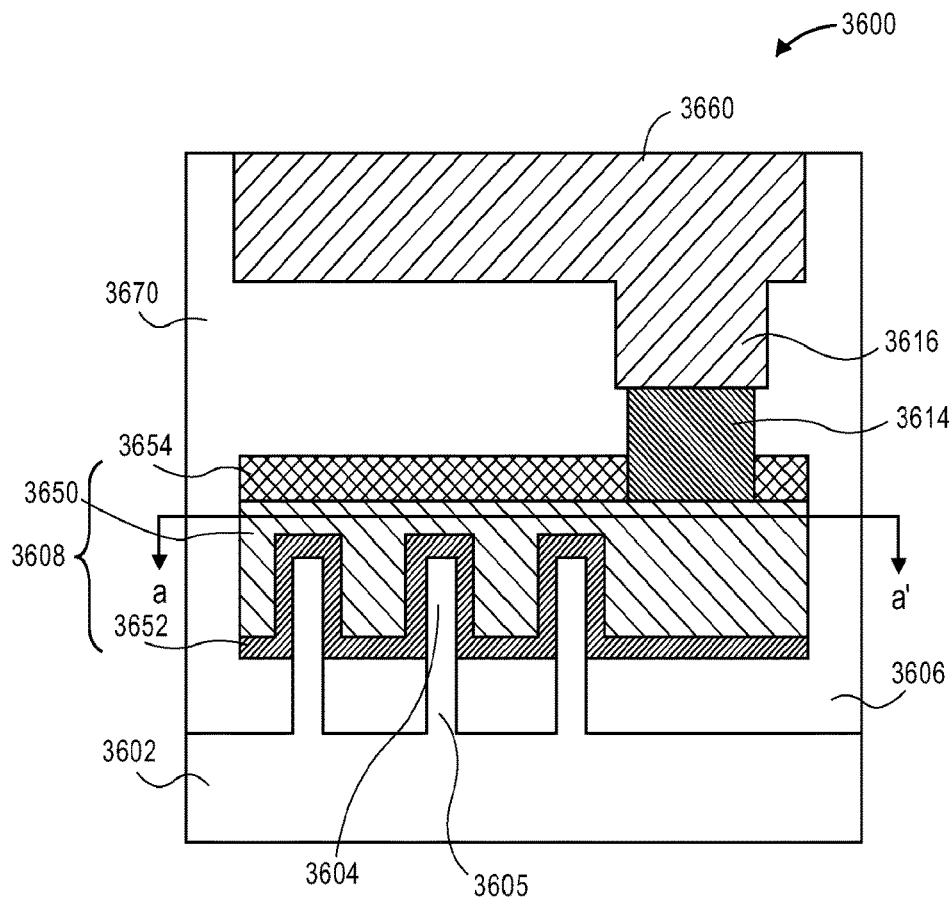
FIG. 36A illustrates a cross-sectional view of a non-planar semiconductor device having fins, in accordance with an embodiment of the present invention.

Referring to FIG. 36A, a semiconductor structure or device 3600 includes a non-planar active region (e.g., a fin structure including protruding fin portion 3604 and sub-fin region 3605) formed from substrate 3602, and within isolation region 3606. A gate line 3608 is disposed over the protruding portions 3604 of the non-planar active region as well as over a portion of the isolation region 3606. As shown, gate line 3608 includes a gate electrode 3650 and a gate dielectric layer 3652. In one embodiment, gate line 3608 may also include a dielectric cap layer 3654. A gate contact 3614, and overlying gate contact via 3616 are also seen from this perspective, along with an overlying metal interconnect 3660, all of which are disposed in inter-layer dielectric stacks or layers 3670. Also seen from the perspective of FIG. 36A, the gate contact 3614 is, in one embodiment, disposed over isolation region 3606, but not over the non-planar active regions.

Figure 36B:
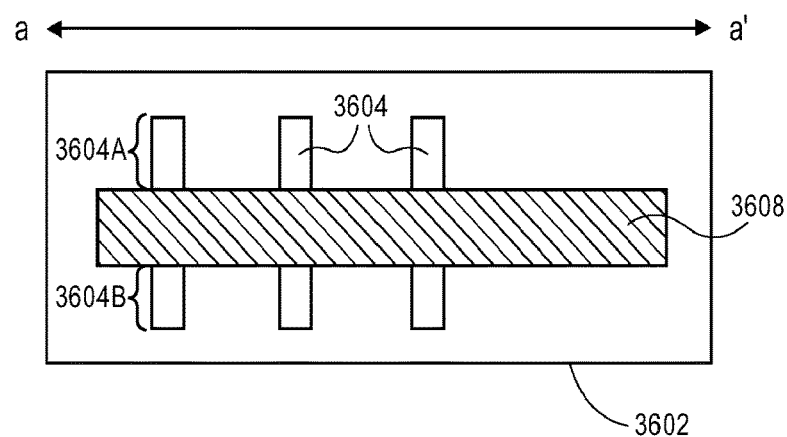
FIG. 36B illustrates a plan view taken along the a-a' axis of the semiconductor device of FIG. 36A, in accordance with an embodiment of the present invention.

Referring to FIG. 36B, the gate line 3608 is shown as disposed over the protruding fin portions 3604. Source and drain regions 3604A and 3604B of the protruding fin portions 3604 can be seen from this perspective. In one embodiment, the source and drain regions 3604A and 3604B are doped portions of original material of the protruding fin portions 3604. In another embodiment, the material of the protruding fin portions 3604 is removed and replaced with another semiconductor material, e.g., by epitaxial deposition. In either case, the source and drain regions 3604A and 3604B may extend below the height of dielectric layer 3606, i.e., into the sub-fin region 3605.

In an embodiment, the semiconductor structure or device 3600 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 3608 surround at least a top surface and a pair of sidewalls of the three-dimensional body.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 37:
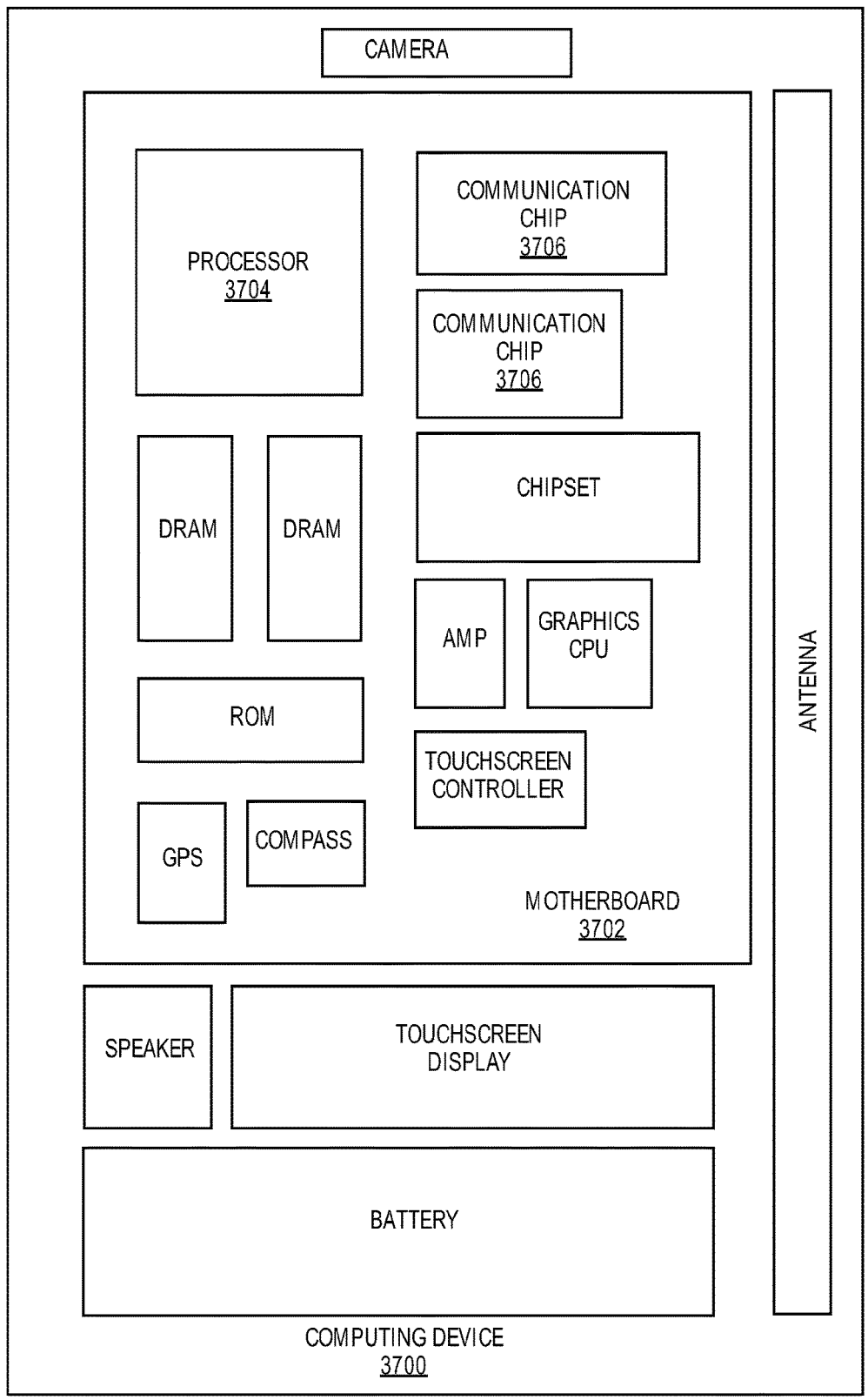
FIG. 37 illustrates a computing device in accordance with one implementation of the invention.

FIG. 37 illustrates a computing device 3700 in accordance with one implementation of the invention. The computing device 3700 houses a board 3702. The board 3702 may include a number of components, including but not limited to a processor 3704 and at least one communication chip 3706. The processor 3704 is physically and electrically coupled to the board 3702. In some implementations the at least one communication chip 3706 is also physically and electrically coupled to the board 3702. In further implementations, the communication chip 3706 is part of the processor 3704.

Depending on its applications, computing device 3700 may include other components that may or may not be physically and electrically coupled to the board 3702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 3706 enables wireless communications for the transfer of data to and from the computing device 3700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 3706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 3700 may include a plurality of communication chips 3706. For instance, a first communication chip 3706 may be dedicated to shorter range wireless communications such as Wi-Fi and Bluetooth and a second communication chip 3706 may be dedicated to longer range wireless communications such as GPS, EDGE, GPRS, CDMA, WiMAX, LTE, Ev-DO, and others.

The processor 3704 of the computing device 3700 includes an integrated circuit die packaged within the processor 3704. In some implementations of the invention, the integrated circuit die of the processor includes one or more structures fabricated using CEBL, in accordance with implementations of embodiments of the invention. The term "processor" may refer to any device or portion of a device that processes electronic data from registers and/or memory to transform that electronic data into other electronic data that may be stored in registers and/or memory.

The communication chip 3706 also includes an integrated circuit die packaged within the communication chip 3706. In accordance with another implementation of embodiments of the invention, the integrated circuit die of the communication chip includes one or more structures fabricated using CEBL, in accordance with implementations of embodiments of the invention.

In further implementations, another component housed within the computing device 3700 may contain an integrated circuit die that includes one or more structures fabricated using CEBL, in accordance with implementations of embodiments of the invention.

In various implementations, the computing device 3700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 3700 may be any other electronic device that processes data.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with an ebeam tool such as described in association with FIG. 4 and/or FIGS. 24A-24C. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 38:
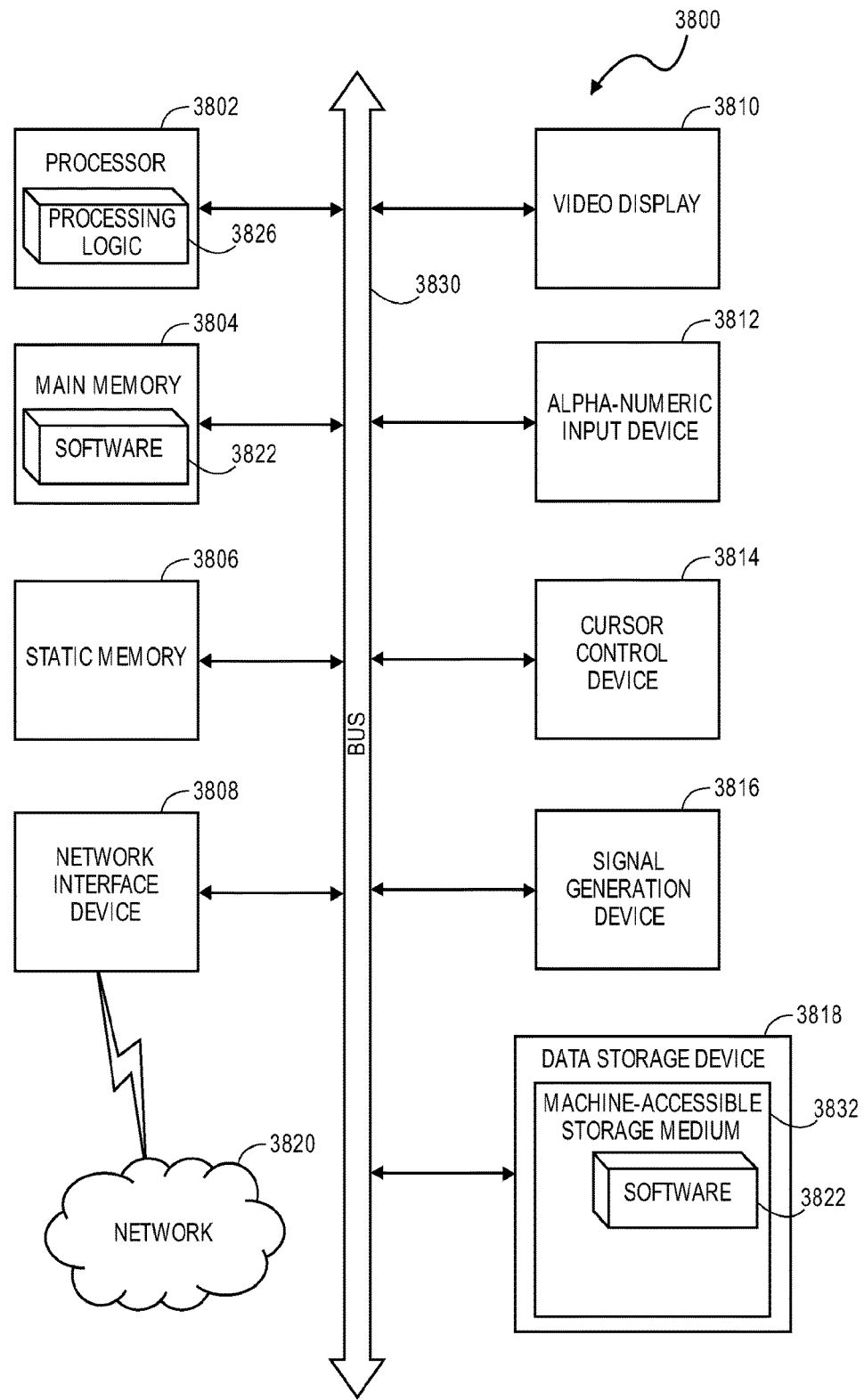
FIG. 38 illustrates a block diagram of an exemplary computer system, in accordance with an embodiment of the present invention.

FIG. 38 illustrates a diagrammatic representation of a machine in the exemplary form of a computer system 3800 within which a set of instructions, for causing the machine to perform any one or more of the methodologies described herein (such as end-point detection), may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 3800 includes a processor 3802, a main memory 3804 (e.g., read-only memory (ROM), flash memory, dynamic random access memory (DRAM) such as synchronous DRAM (SDRAM) or Rambus DRAM (RDRAM), etc.), a static memory 3806 (e.g., flash memory, static random access memory (SRAM), etc.), and a secondary memory 3818 (e.g., a data storage device), which communicate with each other via a bus 3830.

Processor 3802 represents one or more general-purpose processing devices such as a microprocessor, central processing unit, or the like. More particularly, the processor 3802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 3802 may also be one or more special-purpose processing devices such as an application specific integrated circuit (ASIC), a field programmable gate array (FPGA), a digital signal processor (DSP), network processor, or the like. Processor 3802 is configured to execute the processing logic 3826 for performing the operations described herein.

The computer system 3800 may further include a network interface device 3808. The computer system 3800 also may include a video display unit 3810 (e.g., a liquid crystal display (LCD), a light emitting diode display (LED), or a cathode ray tube (CRT)), an alphanumeric input device 3812 (e.g., a keyboard), a cursor control device 3814 (e.g., a mouse), and a signal generation device 3816 (e.g., a speaker).

The secondary memory 3818 may include a machine-accessible storage medium (or more specifically a computer-readable storage medium) 3832 on which is stored one or more sets of instructions (e.g., software 3822) embodying any one or more of the methodologies or functions described herein. The software 3822 may also reside, completely or at least partially, within the main memory 3804 and/or within the processor 3802 during execution thereof by the computer system 3800, the main memory 3804 and the processor 3802 also constituting machine-readable storage media. The software 3822 may further be transmitted or received over a network 3820 via the network interface device 3808.

While the machine-accessible storage medium 3832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorus, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorus. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 39:
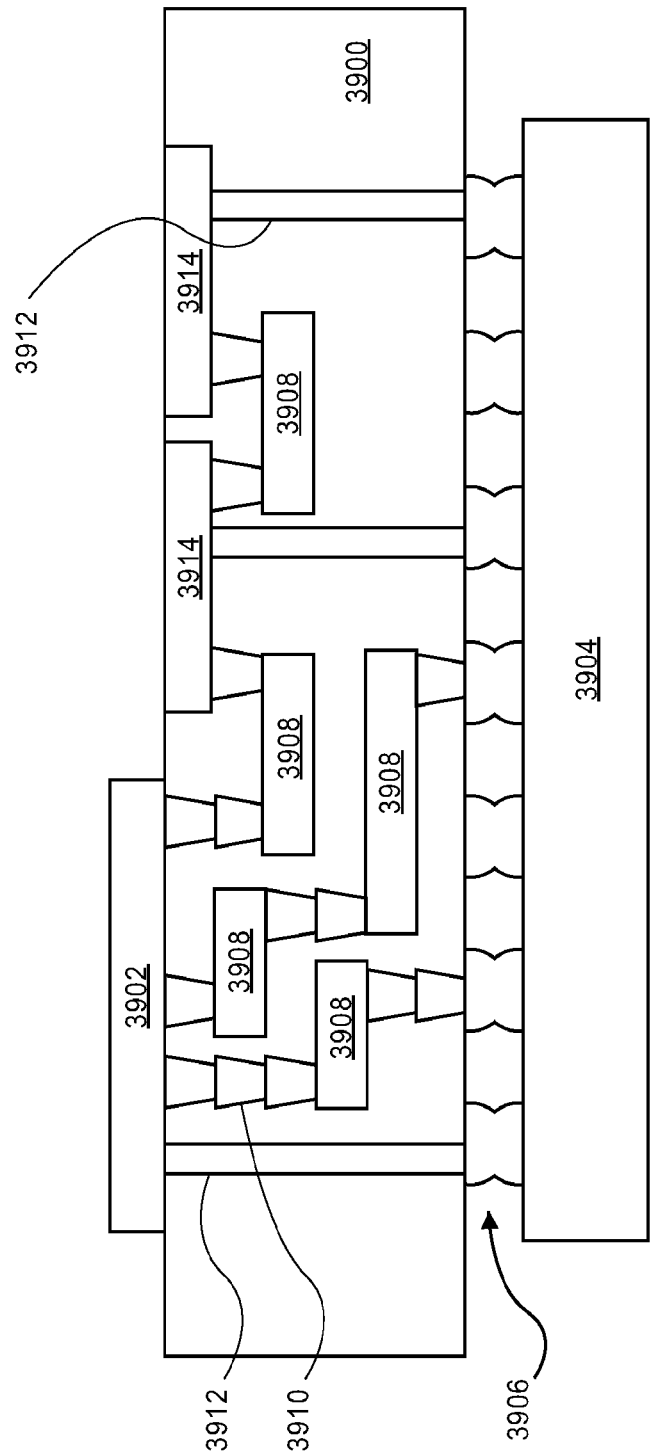
FIG. 39 is an interposer implementing one or more embodiments of the invention.

FIG. 39 illustrates an interposer 3900 that includes one or more embodiments of the invention. The interposer 3900 is an intervening substrate used to bridge a first substrate 3902 to a second substrate 3904. The first substrate 3902 may be, for instance, an integrated circuit die. The second substrate 3904 may be, for instance, a memory module, a computer motherboard, or another integrated circuit die. Generally, the purpose of an interposer 3900 is to spread a connection to a wider pitch or to reroute a connection to a different connection. For example, an interposer 3900 may couple an integrated circuit die to a ball grid array (BGA) 3906 that can subsequently be coupled to the second substrate 3904. In some embodiments, the first and second substrates 3902/3904 are attached to opposing sides of the interposer 3900. In other embodiments, the first and second substrates 3902/3904 are attached to the same side of the interposer 3900. And in further embodiments, three or more substrates are interconnected by way of the interposer 3900.

The interposer 3900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 3908 and vias 3910, including but not limited to through-silicon vias (TSVs) 3912. The interposer 3900 may further include embedded devices 3914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 3900.

In accordance with embodiments of the invention, apparatuses or processes disclosed herein may be used in the fabrication of interposer 3900.

Figure 40:
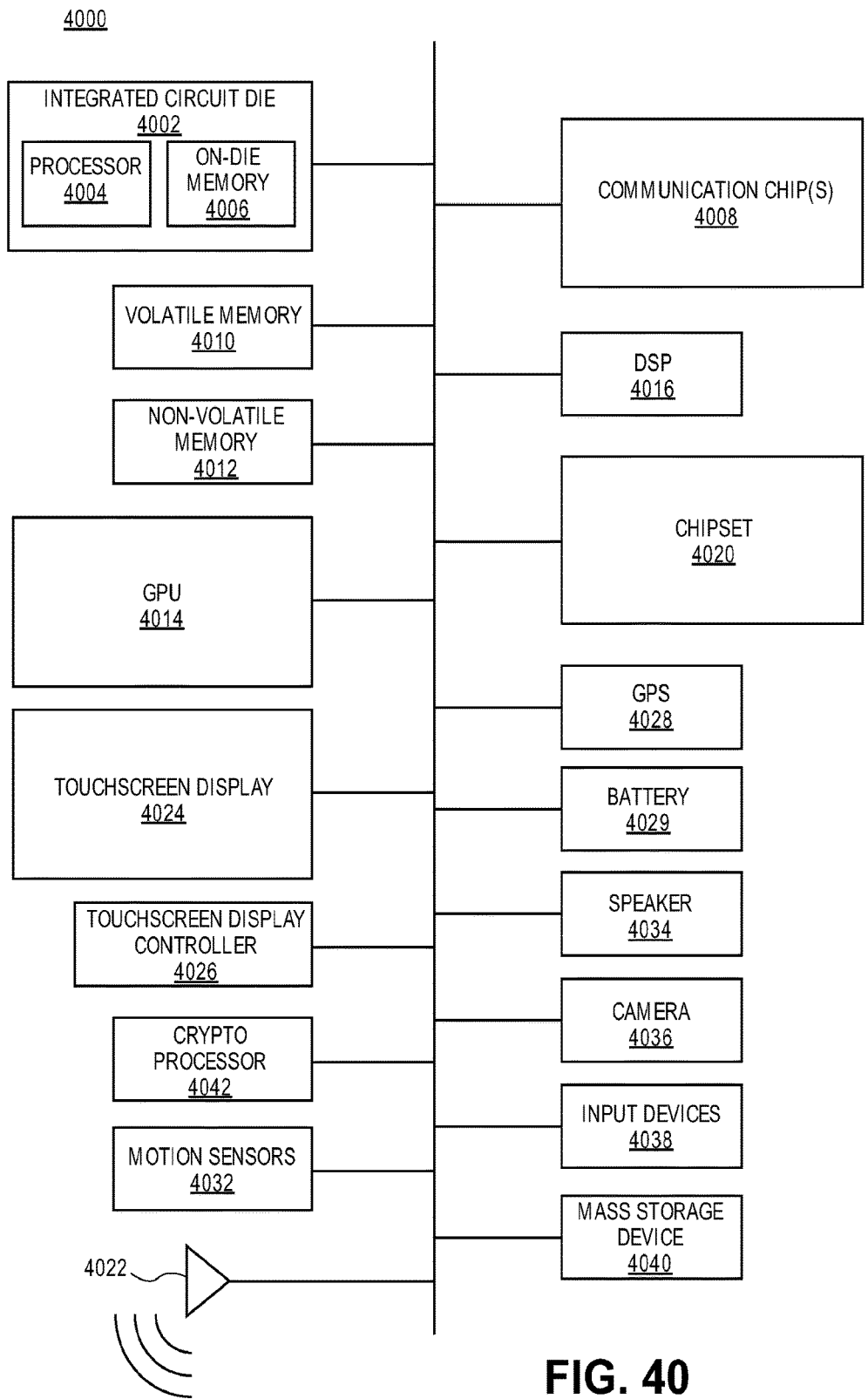
FIG. 40 is a computing device built in accordance with an embodiment of the invention.

FIG. 40 illustrates a computing device 4000 in accordance with one embodiment of the invention. The computing device 4000 may include a number of components. In one embodiment, these components are attached to one or more motherboards. In an alternate embodiment, these components are fabricated onto a single system-on-a-chip (SoC) die rather than a motherboard. The components in the computing device 4000 include, but are not limited to, an integrated circuit die 4002 and at least one communication chip 4008. In some implementations the communication chip 4008 is fabricated as part of the integrated circuit die 4002. The integrated circuit die 4002 may include a CPU 4004 as well as on-die memory 4006, often used as cache memory, that can be provided by technologies such as embedded DRAM (eDRAM) or spin-transfer torque memory (STTM or STTM-RAM).

Computing device 4000 may include other components that may or may not be physically and electrically coupled to the motherboard or fabricated within an SoC die. These other components include, but are not limited to, volatile memory 4010 (e.g., DRAM), non-volatile memory 4012 (e.g., ROM or flash memory), a graphics processing unit 4014 (GPU), a digital signal processor 4016, a crypto processor 4042 (a specialized processor that executes cryptographic algorithms within hardware), a chipset 4020, an antenna 4022, a display or a touchscreen display 4024, a touchscreen controller 4026, a battery 4029 or other power source, a power amplifier (not shown), a global positioning system (GPS) device 4028, a compass 4030, a motion coprocessor or sensors 4032 (that may include an accelerometer, a gyroscope, and a compass), a speaker 4034, a camera 4036, user input devices 4038 (such as a keyboard, mouse, stylus, and touchpad), and a mass storage device 4040 (such as hard disk drive, compact disk (CD), digital versatile disk (DVD), and so forth).

The communications chip 4008 enables wireless communications for the transfer of data to and from the computing device 4000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 4008 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 4000 may include a plurality of communication chips 4008. For instance, a first communication chip 4008 may be dedicated to shorter range wireless communications such as Wi-Fi and Bluetooth and a second communication chip 4008 may be dedicated to longer range wireless communications such as GPS, EDGE, GPRS, CDMA, WiMAX, LTE, Ev-DO, and others.

The processor 4004 of the computing device 4000 includes one or more structures fabricated using CEBL, in accordance with implementations of embodiments of the invention. The term "processor" may refer to any device or portion of a device that processes electronic data from registers and/or memory to transform that electronic data into other electronic data that may be stored in registers and/or memory.

The communication chip 4008 may also include one or more structures fabricated using CEBL, in accordance with implementations of embodiments of the invention.

In further embodiments, another component housed within the computing device 4000 may contain one or more structures fabricated using CEBL, in accordance with implementations of embodiments of the invention.

In various embodiments, the computing device 4000 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 4000 may be any other electronic device that processes data.

The above description of illustrated implementations of embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In an embodiment, a blanker aperture array (BAA) for an e-beam tool includes a first column of openings along a first direction. The BAA also includes a second column of openings along the first direction and staggered from the first column of openings. The first and second columns of openings together form an array having a pitch in the first direction. A scan direction of the BAA is along a second direction, orthogonal to the first direction. The pitch of the array corresponds to half of a minimal pitch layout of a target pattern of lines for orientation parallel with the second direction.

In one embodiment, the first column of openings is a first single column of openings aligned in the first direction, and the second column of openings is a second single column of openings aligned in the first direction.

In one embodiment, when scanned along the second direction, the openings of the first column of openings do not overlap with the openings of the second column of openings.

In one embodiment, when scanned along the second direction, the openings of the first column of openings slightly overlap with the openings of the second column of openings.

In one embodiment, the first and second columns of openings are first and second columns of apertures formed in a thin slice of silicon.

In one embodiment, one or more of the apertures of the first and second columns of apertures has metal there around.

In one embodiment, the pitch of the array corresponds to an approximately 10 nanometer e-beam spot size pitch, and the minimal pitch layout of the target pattern of lines is approximately 20 nanometers.

In one embodiment, the first and second columns of openings amount to a total of 8192 apertures formed in a thin slice of silicon.

In an embodiment, a method of forming a pattern for a semiconductor structure involves forming a pattern of parallel lines above a substrate. The pattern of parallel lines has a minimal pitch layout. The method also involves aligning the substrate in an e-beam tool to provide the pattern of parallel lines parallel with a scan direction of the e-beam tool. The e-beam tool includes a blanker aperture array (BAA) having a first array of openings along an array direction and a second array of openings along the array direction and staggered from the first array of openings. The first and second arrays of openings form an array having a pitch in the array direction. The array direction is orthogonal to the scan direction. The pitch of the array corresponds to half of the minimal pitch layout of the pattern of parallel lines. The method also involves forming a pattern of cuts or vias in or above the pattern of parallel lines to provide line breaks for the pattern of parallel lines by scanning the substrate along the scan direction.

In one embodiment, forming the pattern of parallel lines involves using a pitch halving or pitch quartering technique.

In one embodiment, forming the pattern of cuts or vias involves exposing regions of a layer of photo-resist material.

In an embodiment, a column for e-beam tool includes an electron source for providing a beam of electrons. A limiting aperture is coupled with the electron source along a pathway of the beam of the beam of electrons. High aspect ratio illumination optics are coupled with the limiting aperture along the pathway of the beam of the beam of electrons. A shaping aperture is coupled with the high aspect ratio illumination optics along the pathway of the beam of the beam of electrons. A blanker aperture array (BAA) is coupled with the shaping aperture along the pathway of the beam of the beam of electrons. The BAA includes a first array of openings along in a first direction. The BAA also includes a second array of openings along the first direction and staggered from the first array of openings. The first and second arrays of openings together form an array having a pitch in the first direction. The column further includes a final aperture coupled with the BAA along the pathway of the beam of the beam of electrons. The column also includes a sample stage for receiving the beam of electrons. A scan direction of the sample stage is along a second direction, orthogonal to the first direction of the BAA. The pitch of the array of the BAA corresponds to half of a minimal pitch layout of a target pattern of lines for orientation parallel with the second direction.

In one embodiment, when the sample stage is scanned along the second direction, the openings of the first array of openings of the BAA do not overlap with the openings of the second array of openings of the BAA.

In one embodiment, when the sample stage is scanned along the second direction, the openings of the first array of openings of the BAA slightly overlap with the openings of the second array of openings of the BAA.

In one embodiment, the BAA is an array of physical apertures disposed in a thin slice of silicon.

In one embodiment, one or more of the apertures of the first and second arrays of apertures of the BAA has metal there around.

In one embodiment, the metal comprises one or more electrodes for passing or steering a portion of the beam of electrons to a Faraday cup or blanking aperture housed in the column.

In one embodiment, the pitch of the array of the BAA corresponds to an approximately 10 nanometer e-beam spot size pitch, and the minimal pitch layout of the target pattern of lines is approximately 20 nanometers.

In one embodiment, the BAA has 8192 apertures.

In one embodiment, the shaping aperture is a one-dimensional shaping aperture.

In one embodiment, the sample stage is rotatable by 90 degrees to accommodate alternating orthogonal layer patterning.

What is claimed is:

1. A blanker aperture array (BAA) for an e-beam tool, the BAA comprising:
   a first column of openings along a first direction; and
   a second column of openings along the first direction and staggered from the first column of openings, the first and second columns of openings together forming an array having a pitch in the first direction, wherein a scan direction of the BAA is along a second direction, orthogonal to the first direction, and wherein the pitch of the array corresponds to half a minimal pitch layout of a target pattern of lines for orientation parallel with the second direction.

2. The BAA of claim 1, wherein the first column of openings is a first single column of openings aligned in the first direction, and the second column of openings is a second single column of openings aligned in the first direction.

3. The BAA of claim 1, wherein, when scanned along the second direction, the openings of the first column of openings do not overlap with the openings of the second column of openings.

4. The BAA of claim 1, wherein, when scanned along the second direction, the openings of the first column of openings slightly overlap with the openings of the second column of openings.

5. The BAA of claim 1, wherein the first and second columns of openings are first and second columns of apertures formed in a thin slice of silicon.

6. The BAA of claim 5, wherein one or more of the apertures of the first and second columns of apertures has metal there around.

7. The BAA of claim 1, wherein the pitch of the array corresponds to an approximately 10 nanometer e-beam spot size pitch, and the minimal pitch layout of the target pattern of lines is approximately 20 nanometers.

8. The BAA of claim 1, wherein the first and second columns of openings amount of a total 8192 apertures formed in a thin slice of silicon.

* * * * *